(12) United States Patent
Azami

(10) Patent No.: US 7,403,038 B2
(45) Date of Patent: *Jul. 22, 2008

(54) SEMICONDUCTOR DEVICE AND DISPLAY DEVICE

(75) Inventor: Munehiro Azami, Kanagawa-ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/276,189

(22) Filed: Feb. 17, 2006

(65) Prior Publication Data

US 2006/0187166 A1   Aug. 24, 2006

Related U.S. Application Data

(63) Continuation of application No. 10/206,802, filed on Jul. 29, 2002, now Pat. No. 7,068,076.

(30) Foreign Application Priority Data

Aug. 3, 2001   (JP)   ............... 2001-236953

(51) Int. Cl.
  *H03K 19/0175* (2006.01)
  *H03K 19/094* (2006.01)
(52) U.S. Cl. ............... 326/83; 326/112; 327/108
(58) Field of Classification Search ............... 326/83, 326/86, 112–114
  See application file for complete search history.

(56) References Cited

U.S. PATENT DOCUMENTS

| 3,506,851 | A | 4/1970 | Polkinghorn |
| 3,774,055 | A | 11/1973 | Bapat |
| 3,898,479 | A | 8/1975 | Proebsting |
| 4,090,096 | A | 5/1978 | Nagami |
| 4,390,803 | A | 6/1983 | Koike |
| 4,412,139 | A | 10/1983 | Horninger |

(Continued)

FOREIGN PATENT DOCUMENTS

EP   1 063 630   12/2000

(Continued)

OTHER PUBLICATIONS

Australian Patent Office Search Report from Application No. SG200202969-2, dated Apr. 27, 2004.

(Continued)

*Primary Examiner*—James H Cho
(74) *Attorney, Agent, or Firm*—Fish & Richardson P.C.

(57) ABSTRACT

A circuit capable of reducing a consumption current is provided for a digital display device composed of unipolar TFTs. There is provided a latch circuit for holding a digital video signal. According to the latch circuit, when the digital video signal is inputted to an input electrode of a TFT (101), a non-inverting output signal is outputted from an output electrode of the TFT (101) and an inverting output signal is outputted from output electrodes of TFTs (102 and 103). Two line outputs of non-inversion and inversion are obtained. Thus, when a buffer located in a subsequent stage is operated, a period for which a direct current path is produced between a high potential and a low potential of a power source can be shortened, thereby contributing to reduction in a consumption current.

42 Claims, 17 Drawing Sheets

U.S. PATENT DOCUMENTS

| | | | |
|---|---|---|---|
| 4,633,105 A | 12/1986 | Tsujimoto | |
| 4,804,870 A | 2/1989 | Mahmud | |
| 4,959,697 A | 9/1990 | Shier | |
| 5,467,038 A | 11/1995 | Motley. | |
| 5,548,143 A | 8/1996 | Lee | |
| 5,643,826 A | 7/1997 | Ohtani | |
| 5,694,061 A | 12/1997 | Morosawa | |
| 5,870,071 A | 2/1999 | Kawahata | |
| 5,889,291 A | 3/1999 | Koyama | |
| 5,949,271 A | 9/1999 | Fujikura | |
| 5,952,991 A | 9/1999 | Akiyama | |
| 6,040,810 A | 3/2000 | Nishimura | |
| 6,049,228 A | 4/2000 | Moon | |
| 6,366,125 B1 * | 4/2002 | Rochard | 326/82 |
| 6,384,804 B1 | 5/2002 | Dodabalapur | |
| 6,501,098 B2 | 12/2002 | Yamazaki | |
| 6,522,323 B1 | 2/2003 | Sasaki | |
| 6,542,138 B1 | 4/2003 | Shannon | |
| 6,686,899 B2 | 2/2004 | Miyazawa | |
| 7,068,076 B2 * | 6/2006 | Azami | 326/83 |
| 2001/0002703 A1 | 6/2001 | Koyama | |
| 2001/0045565 A1 | 11/2001 | Yamazaki | |
| 2002/0011973 A1 | 1/2002 | Komiya | |
| 2002/0044208 A1 | 4/2002 | Yamazaki | |
| 2002/0097212 A1 | 7/2002 | Miyazawa | |
| 2002/0158666 A1 | 10/2002 | Azami | |
| 2002/0167026 A1 | 11/2002 | Azami | |
| 2002/0190326 A1 | 12/2002 | Nagao | |
| 2003/0011584 A1 | 1/2003 | Azami | |
| 2003/0020520 A1 | 1/2003 | Miyake | |
| 2003/0052324 A1 | 3/2003 | Kimura | |
| 2003/0111677 A1 | 6/2003 | Miyake | |

FOREIGN PATENT DOCUMENTS

| | | |
|---|---|---|
| EP | 1 139 326 | 10/2001 |
| JP | 55-156427 | 12/1980 |
| JP | 59-16424 | 1/1984 |
| JP | 60-140924 | 7/1985 |
| JP | 63-204815 | 8/1988 |
| JP | 03-165171 | 7/1991 |
| JP | 06-98081 | 4/1994 |
| JP | 09-186312 | 7/1997 |
| JP | 09-246936 | 9/1997 |
| JP | 2000-106617 | 4/2000 |
| JP | 2001-005426 | 1/2001 |
| JP | 2001-109394 | 4/2001 |
| JP | 2001-133431 | 5/2001 |
| JP | 2002-176162 | 6/2002 |
| JP | 2002-251164 | 9/2002 |

OTHER PUBLICATIONS

Australian Patent Office Written Opinion from Application No. SG200202969-2, dated Apr. 27, 2004.

* cited by examiner

SEMICONDUCTOR DEVICE AND DISPLAY DEVICE

BACKGROUND OF THE INVENTION

1. Field of the Invention

The present invention relates to a display device for displaying an image using inputted digital video signals. Note that a display device in this specification includes a liquid crystal display device using a liquid crystal element for a pixel and a light emitting device using a light emitting element represented by an electroluminescence (EL) element. A semiconductor device includes a circuit for performing processing for inputting video signals to pixels arranged in a display device to display an image. Here, more particularly, the semiconductor device includes a pulse output circuit represented by a shift register circuit, a latch circuit, a buffer circuit, a level shift circuit, or the like, or an amplifying circuit represented by an amplifier or the like.

2. Description of the Related Art

Display devices manufactured by forming semiconductor thin films on an insulator such as a glass substrate, in particular active matrix display devices represented by LCDs (liquid crystal displays) using thin film transistors (hereinafter referred to as TFTs) are being utilized in many manufactured products in recent years, and are spreading. The active matrix display devices using TFTs have from several hundred thousand to several million pixels arranged in a matrix shape, and display of an image is performed by controlling an electric charge of each pixel by TFTs disposed in each pixel.

In addition, techniques relating to polysilicon TFTs in which TFTs are used for a peripheral region of a pixel portion in addition to pixel TFTs constituting pixels to thereby form a driver circuit and the pixel portion on a substrate at the same time have also been developed recently. This contributes greatly to a reduction of the device in size and to a reduction of electric power consumption, and accordingly the display devices have come to be indispensable devices which are used in display portions of mobile information terminals and the like, whose fields of application have expanded remarkably in recent years.

In general, CMOS circuits in which N-channel TFTs and P-channel TFTs are combined are used as circuits for structuring semiconductor devices. However, the CMOS circuits require complex manufacturing processes, which leads to an increase in manufacturing cost and to a decrease in yield.

If all TFTs which compose the semiconductor device and the pixel portion can be produced to be unipolar, a part of the steps of adding an impurity element to a semiconductor layer can be omitted. Thus, the above problem can be solved.

Here, FIG. 10 shows a configuration of a source signal line driver circuit in a digital video input type display device as an example of a general semiconductor device. The source signal line driver circuit includes a shift register 1000 having plural stages of pulse output circuits 1001 for outputting a sampling pulse in succession in accordance with a clock signal (S-CK), a clock inverting signal (S-CKb), and a start pulse (SP), first latch circuits 1002 for holding 3 bits of digital video signals (Data1 to Data3) in accordance with an input of the sampling pulse, second latch circuits 1003 for holding the digital video signals in accordance with an input of a latch pulse (Latch Pulse), and D/A converting circuits 1004 for converting the digital video signals into analog video signals. Although not shown particularly, the driver circuit may include a buffer and the like. In addition, it is needless to say that the number of bits of the digital video signals is not limited to 3 bits.

The operation will be described briefly. The shift register 1000 outputs the sampling pulse in succession in accordance with inputs of the clock signal and the start pulse. The first latch circuits 1002 hold the digital video signals (Data1 to Data3) in response to timing when the sampling pulse is inputted thereto. After such an operation is conducted for one horizontal period, the latch pulse (Latch Pulse) is inputted to the second latch circuits 1003 during a horizontal retrace period. Thus, all of the digital video signals corresponding to one horizontal period which are held in the first latch circuits 1002 are transferred to the second latch circuits 1003. After that, the digital video signals are inputted to the D/A converting circuits 1004, converted into voltage signals corresponding to respective gray scales, and supplied to source signal lines (S0001 to S(final)).

The case where such a driver circuit is composed of unipolar TFTs will be described.

FIG. 5A shows a shift register composed of unipolar TFTs. The shift resistor includes plural stages of pulse output circuits 500 for outputting the sampling pulse in accordance with the clock signal and the start pulse. FIG. 5B is a circuit diagram of a single pulse output circuit. When a logic circuit is composed of unipolar TFTs, for example, N-channel TFTs, there is a problem in that an amplitude of an output signal is reduced as compared with that of an input signal by a threshold value of an N-channel TFT connected with a high potential side terminal of a power source. The pulse output circuit shown here solves such a problem by a bootstrap method and has been applied with Japanese Patent Application No. 2001-141347 by the same inventor(s) et al.

The operation of the circuit shown in FIG. 5B will be described briefly. Here, the unipolar TFTs composing the circuit are assumed to be N-channel TFTs and respective threshold voltages are assumed to be uniformly VthN. However, in a configuration of the circuit, it is not limited to an N-channel type.

The operation will be described. Note that there is the case where the operation of TFTs is described while the operation of the circuit is described. Here, the followings are assumed. When a TFT is turned ON, an absolute value of a voltage between the gate and the source of the TFT exceeds that of a threshold voltage of the TFT, so that an electrical connection state is obtained between the source region and the drain region of the TFT through the channel formation region. In addition, when a TFT is turned OFF, an absolute value of a voltage between the gate and the source of the TFT falls below that of a threshold voltage of the TFT, so that a non-electrical connection state is obtained between the source region and the drain region of the TFT.

Also, in order to describe a connection relationship of TFTs in this specification, the case of indicating terms "a gate electrode, an input electrode, and an output electrode" and the case of indicating terms "a gate electrode, a source region, and a drain region" are separately used. When the operation of the TFT is described, a voltage between the gate and the source is considered in many cases. However, it is difficult to make a positive distinction between the source region and the drain region of the TFT from the viewpoint of the structure thereof. Thus, when the input and output of a signal are described, they are called the input electrode and the output electrode. On the other hand, when a relationship of potentials in electrodes of the TFT is described, any one of the input electrode and the output electrode is called the source region and the other is called the drain region.

Further, amplitudes of signals in the description are assumed to be in a range of VDD to VSS, a high potential of a power source is given by VDD, and a low potential of the power source is given by VSS. In addition, it is assumed that VthN<(VDD−VthN) is satisfied. In order to simplify a relationship among respective potentials, it is considered to be VSS=0 V. However, when the circuit is actually operated, it is not limited to this.

In an m-th stage (1<m≦n) of pulse output circuit, when an (m−1)-th stage of output pulse is inputted to the gate electrodes of TFTs 501 and 504 (in the case of m=1, that is, in the case of the first stage, the start pulse SP is inputted thereto), the gate electrodes become an H (high) level so that the TFTs 501 and 504 are turned ON. Thus, a potential of the gate electrode of a TFT 505 is risen toward the VDD side. Then, when the potential reaches (VDD−VthN), the TFT 501 is turned OFF to obtain a floating state (where VthN<(VDD−VthN)). Therefore, the TFT 505 is turned ON. On the other hand, a pulse is not inputted to the gate electrodes of TFTs 502 and 503 at this time, thereby keeping the gate electrode in an L (low) level so that they are in an OFF state. Thus, a potential of the gate electrode of a TFT 506 is an L level so that it is in an OFF state. Therefore, when the clock signal CK inputted from the input electrode of the TFT 505 becomes an H level, a potential of an output terminal (SR Out) is risen toward the VDD side.

Here, a capacitor means 507 is provided between the gate electrode and the output electrode of the TFT 505. In addition, at this time, the gate electrode of the TFT 505 is in a floating state. Thus, a potential of the gate electrode of the TFT 505 is further risen from (VDD−VthN) by a bootstrap with rising a potential of the output terminal (SR Out). As a result, the potential of the gate electrode of the TFT 505 becomes a higher potential than (VDD+VthN). Accordingly, the potential of the output terminal (SR Out) is completely risen to VDD without reducing the potential by a threshold value of the TFT 505.

Similarly, in the case of a (m+1)-th stage, a pulse is outputted in accordance with the clock inverting signal S-CKb. An (m+1)-th stage of output pulse is fed back to the m-th stage and inputted to the gate electrodes of the TFTs 502 and 503. Thus, the gate electrodes of the TFTs 502 and 503 become in an H level so that they are turned ON. As a result, the potential of the gate electrode of the TFT 505 is fallen toward the VSS side and then the TFT 505 is turned OFF. Simultaneously, the potential of the gate electrode of the TFT 506 becomes an H level so that it is turned ON. Thus, the potential of the output terminal (SR Out) of the m-th stage becomes an L level.

Next, an example in which a latch circuit is composed of unipolar TFTs is shown in FIG. 6A. A circuit indicated by a dotted frame 601 corresponds to a first latch circuit and a circuit indicated by a dotted from 602 corresponds to a second latch circuit. A circuit indicated by a dotted frame 603 corresponds to a buffer circuit and is also shown in FIG. 6B. Note that a configuration of the buffer circuit 603 has been applied with Japanese Patent Application No. 2001-133431 by the same inventor(s) et al. The first latch circuit 601 has a TFT 604 and a capacitor means 605. The digital video signal (Data) of 1 bit is inputted to the input electrode of the TFT 604 and a sampling pulse (Samp. Pulse) is inputted to the gate electrode thereof. When the sampling pulse is inputted, the TFT 604 is turned ON and the digital video signal is held in the capacitor means 605.

The second latch circuit 602 has a TFT 606 and a capacitor means 607. The digital video signal held in the first latch circuit is inputted to the input electrode of the TFT 606 and a latch pulse (Latch Pulse) is inputted to the gate electrode thereof. When the latch pulse is inputted, the TFT 606 is turned ON and the digital video signal is held in the capacitor means 607.

The buffer 603 has TFTs 608 to 611 and a capacitor means 612. The digital video signal held in the second latch circuit is inputted to the gate electrodes of the TFTs 609 and 611. The gate electrode of the TFT 608 is connected with the power source (VDD). Note that, it is constructed such that current power of the TFT 609 is sufficiently larger than that of the TFT 608.

When a signal having an H level is inputted to the gate electrodes of the TFTs 609 and 611, a potential of the gate electrode of the TFT 610 becomes an L level so that the TFT 610 is turned OFF. In addition, the TFT 611 is turned ON so that an L level is produced in an output terminal (Out).

When a signal having an L level is inputted to the gate electrodes of the TFTs 609 and 611, both TFTs 609 and 611 are turned OFF. Thus, the potential of the gate electrode of the TFT 610 is risen through the TFT 608. Then, when the potential reaches (VDD−VthN), a floating state is obtained. Thus, the TFT 610 is turned ON and a potential of the output terminal (Out) is risen. With rising, the potential of the gate electrode of the TFT 610 is further risen by the capacitor means 612, that is, capacitive coupling between the gate electrode and the output electrode of the TFT 610 and becomes higher than (VDD+VthN). As a result, an H level is produced in the output terminal (Out) and the potential thereof becomes equal to VDD.

Note that the buffer may be located between the first latch circuit 601 and the second latch circuit 602.

Here, the buffer 603 operated in response to the output of the second latch circuit is noted. During a period for which the TFT 609 is in an ON state after a signal having an H level is inputted to the TFT 609, a current path is produced through VDD, TFT 608, TFT 609, and VSS. Through the current path, a current continues to flow during a period for which a signal having an H level is outputted from the second latch circuit. In other words, when a digital video signal inputted to a latch circuit is an H level, a current continues to flow for one horizontal period in maximum. Thus, a dramatic increase in a consumption current is caused.

SUMMARY OF THE INVENTION

An object of the present invention is to provide a circuit for reducing a consumption current at the time of a circuit operation.

To solve the problem, the present invention takes means as the following.

A latch circuit as shown in FIG. 6A is one input one output type that is composed of a switching TFT+capacitor means. Thus, the buffer 603 is also one input type.

As a method of preventing a current path being produced when an input signal is an H level, TFTs 608 and 609 are exclusively turned ON or OFF by using an inverting input signal (Inb) against an input signal (In).

In the present invention, the output of the latch circuit is composed of two output type of the output and the inverting output.

The structure of the present invention is described as follows.

A semiconductor device according to the present invention is that: first and second signal input portions; first and second signal output portions; and first and second capacitor means are comprised, wherein a first signal inputted from the first signal input portion is outputted from the first signal output portion and an inverting signal of the first output signal is outputted from the second signal output portion, in accordance with timing of a second signal inputted from the second signal input portion, and the semiconductor device is characterized that the first and second capacitor means keep potentials of the first signal and the inverting signal which are outputted from the first and second signal output portions, respectively.

A semiconductor device according to the present invention is characterized in that: first, second, and third transistors each including a gate electrode, an input electrode, and an output electrode; first and second capacitor means; first and second signal input portions; first and second signal output portions; and first and second power sources are comprised, wherein the first, second, and third transistors have the same conductivity type, the gate electrodes of the first and second transistors are electrically connected with the first signal input portion, the input electrode of the first transistor is electrically connected with the second signal input portion, the output electrode of the first transistor and the gate electrode of the third transistor are electrically connected with the first signal output portion, the input electrode of the second transistor is electrically connected with the first power source, the input electrode of the third transistor is electrically connected with the second power source, the output electrodes of the second and third transistors are electrically connected with the second signal output portion, the first capacitor means is located to the first signal output portion and keeps a potential of a signal outputted from the first signal output portion, and the second capacitor means is located to the second signal output portion and keeps a potential of a signal outputted from the second signal output portion.

A semiconductor device according to the present invention is characterized in that: first, second, and third transistors each including a gate electrode, an input electrode, and an output electrode; first and second capacitor means; first and second signal input portions; first and second signal output portions; and first and second power sources are comprised, wherein the first, second, and third transistors have the same conductivity type, the gate electrodes of the first and second transistors are electrically connected with the first signal input portion, the input electrode of the first transistor is electrically connected with the second signal input portion, the output electrode of the first transistor and the gate electrode of the third transistor are electrically connected with the first signal output portion, the input electrode of the second transistor is electrically connected with the first signal input portion, the input electrode of the third transistor is electrically connected with the second power source, the output electrodes of the second and third transistors are electrically connected with the second signal output portion, the first capacitor means is located to the first signal output portion and keeps a potential of a signal outputted from the first signal output portion, and the second capacitor means is located to the second signal output portion and keeps a potential of a signal outputted from the second signal output portion.

A semiconductor device according to the present invention is characterized in that:

first, second, and third transistors each including a gate electrode, an input electrode, and an output electrode;

first and second capacitor means;

an amplitude compensation buffer circuit provided between the output electrode of the first transistor and a first signal output portion and between the output electrodes of the second and third transistors and a second signal output portion;

first and second signal input portions;

the first and second signal output portions; and first and second power sources are comprised, wherein the first, second, and third transistors have the same conductivity type, the gate electrodes of the first and second transistors are electrically connected with the first signal input portion, the input electrode of the first transistor is electrically connected with the second signal input portion, the output electrode of the first transistor is electrically connected with the gate electrode of the third transistor, the input electrode of the second transistor is electrically connected with the first power source, the input electrode of the third transistor is electrically connected with the second power source, the first capacitor means is located to the output electrode of the first transistor and keeps a potential of a signal outputted from the output electrode of the first transistor, the second capacitor means is located to the output electrodes of the second and third transistors and keeps a potential of a signal outputted from the output electrodes of the second and third transistors, and the amplitude compensation buffer circuit compensates an attenuated amplitude of the signal produced in the output electrode of the first transistor and outputs it to the first signal output portion, and compensates an attenuated amplitude of the signal produced in the output electrodes of the second and third transistors and outputs it to the second signal output portion.

A semiconductor device in according to the present invention is characterized in that:

first, second, and third transistors each including a gate electrode, an input electrode, and an output electrode;

first and second capacitor means;

an amplitude compensation buffer circuit provided between the input electrode of the first transistor and a first signal output portion and between the output electrodes of the second and third transistors and a second signal output portion;

first and second signal input portions;

the first and second signal output portions; and first and second power sources are comprised, wherein the first, second, and third transistors have the same conductivity type, the gate electrodes of the first and second transistors are electrically connected with the first signal input portion, the input electrode of the first transistor is electrically connected with the second signal input portion, the output electrode of the first transistor is electrically connected with the gate electrode of the third transistor, the input electrode of the second transistor is electrically connected with the first signal input portion, the input electrode of the third transistor is electrically connected with the second power source, the first capacitor means is located to the output electrode of the first transistor and keeps a potential of a signal outputted from the output electrode of the first transistor, the second capacitor means is located to the output electrodes of the second and third transistors and keeps a potential of a signal outputted from the output electrodes of the second and third transistors, and the amplitude compensation buffer circuit compensates an attenuated amplitude of the signal produced in the output electrode of the first transistor and outputs it to the first signal output portion, and compensates an attenuated amplitude of the signal produced in the output electrodes of the second and third transistors and outputs it to the second signal output portion.

A semiconductor device according to the present invention is characterized in that: first to seventh transistors each including a gate electrode, an input electrode, and an output electrode; first to fourth capacitor means; first and second signal input portions; first and second signal output portions; and first and second power sources are comprised, wherein the first to seventh transistors have the same conductivity type, the gate electrodes of the first and second transistors are electrically connected with the first signal input portion, the input electrode of the first transistor is electrically connected with the second signal input portion, the output electrode of the first transistor is electrically connected with the gate electrodes of the third, fourth, and fifth transistors, the input electrode of the second transistor is electrically connected with the first power source, the input electrode of the third transistor is electrically connected with the second power source, the output electrode of the second transistor is electrically connected with the output electrode of the third transistor and the gate electrodes of the sixth and seventh transistors, the input electrodes of the fourth and seventh transistors are electrically connected with the first power source, the input electrodes of the fifth and sixth transistors are electrically connected with the second power source, the output electrodes of the fourth and sixth transistors are electrically connected with the first signal output portion, the output electrodes of the fifth and seventh transistors are electrically connected with the second signal output portion, the first capacitor means is located to the output electrode of the first transistor and keeps a potential of a signal outputted from the output electrode of the first transistor, the second capacitor means is located to the output electrodes of the second and third transistors and keeps a potential of a signal outputted from the output electrodes of the second and third transistors, the third capacitor means is located between the gate electrode and the output electrode of the fourth transistor to produce capacitive coupling, and the fourth capacitor means is located between the gate electrode and the output electrode of the seventh transistor to produce capacitive coupling.

A semiconductor device according to the present invention is characterized in that: first to seventh transistors each including a gate electrode, an input electrode, and an output electrode; first to fourth capacitor means; first and second signal input portions; first and second signal output portions; and first and second power sources are comprised, wherein the first to seventh transistors have the same conductivity type, the gate electrodes of the first and second transistors are electrically connected with the first signal input portion, the input electrode of the first transistor is electrically connected with the second signal input portion, the output electrode of the first transistor is electrically connected with the gate electrodes of the third, fourth, and fifth transistors, the input electrode of the second transistor is electrically connected with the first signal input portion, the input electrode of the third transistor is electrically connected with the second power source, the output electrode of the second transistor is electrically connected with the output electrode of the third transistor and the gate electrodes of the sixth and seventh transistors, the input electrodes of the fourth and seventh transistors are electrically connected with the first power source, the input electrodes of the fifth and sixth transistors are electrically connected with the second power source, the output electrodes of the fourth and sixth transistors are electrically connected with the first signal output portion, the output electrodes of the fifth and seventh transistors are electrically connected with the second signal output portion, the first capacitor means is located to the output electrode of the first transistor and keeps a potential of a signal outputted from the output electrode of the first transistor, the second capacitor means is located to the output electrodes of the second and third transistors and keeps a potential of a signal outputted from the output electrodes of the second and third transistors, the third capacitor means is located between the gate electrode and the output electrode of the fourth transistor to produce capacitive coupling, and the fourth capacitor means is located between the gate electrode and the output electrode of the seventh transistor to produce capacitive coupling.

According to the present invention, it is characterized in that the signal outputted from the second signal output portion is an inverting signal of the signal outputted from the first signal output portion.

According to the present invention, the conductivity type can be either n-channel type or p-channel type.

According to the present invention, the first to fourth capacitor means each is one of a first capacitor and a second capacitor, the first capacitor can be produced by the gate electrode and the input electrode of the transistor, and the second capacitor can be produced by the gate electrode and the output electrode of the transistor.

According to the present invention, the first to fourth capacitor means each are composed of two materials selected from the group consisting of a material for forming a semiconductor layer, a material for forming the gate electrode, and a wiring material, and an insulating film interposed therebetween.

DETAILED DESCRIPTION OF THE PREFERRED EMBODIMENTS

Embodiment Mode

Hereinafter, an embodiment mode of the present invention will be described.

Figure 1:
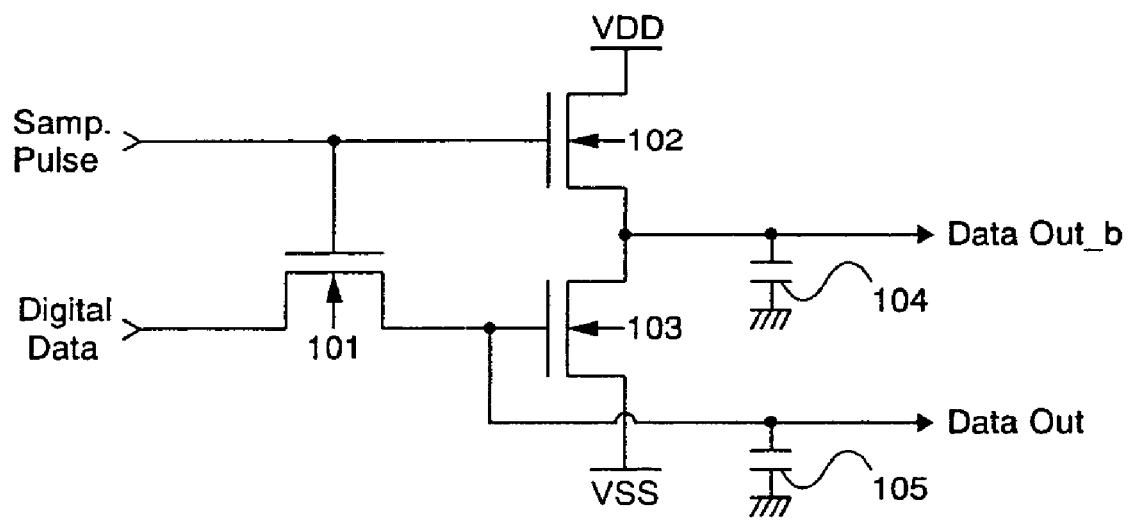
FIG. 1 is a diagram showing an Embodiment Mode.

FIG. 1 shows a configuration of a latch circuit of the present invention. The latch circuit has TFTs 101 to 103 and capacitor means 104 and 105. A sampling pulse (Samp. Pulse) from a shift register is inputted to gate electrodes of the TFTs 101 and 102. A digital video signal (Digital Data) is inputted to an input electrode of the TFT 101. An input electrode of the TFT 102 is connected with a high potential (VDD) side terminal of a power source and an input electrode of the TFT 103 is connected with a low potential (VSS) side terminal of the power source.

The configuration is characterized in that two outputs, that is, an output (Data Out) and an inverting output (Data Out_b) are obtained according to an input of a digital video signal.

The operation of the circuit will be described. Note that respective amplitudes of the sampling pulse and the digital video signal at the time of inputting are assumed to be in a range of VDD to VSS.

The sampling pulse outputted from the shift register is inputted to the gate electrodes of the TFTs 101 and 102. Thus, the TFTs 101 and 102 are turned ON. When an inputted digital video signal is an H level, the signal having the H level is inputted to the gate electrode of the TFT 103 to turn it ON. At this time, both TFTs 102 and 103 are in an ON state. Here, when it is designed that current power of the TFT 103 is sufficiently larger than that of the TFT 102, a signal having an L level is produced in output electrodes of the TFTs 102 and 103, that is, an inverting output terminal (Data Out_b). With respect to the output terminal (Data Out), the digital video signal is outputted through the TFT 101 without modification.

On the other hand, when an inputted digital video signal is an L level, the signal having the L level is inputted to the gate electrode of the TFT 103 to turn it OFF. Thus, a signal having an H level is produced in the inverting output terminal (Data Out_b). With respect to the output terminal (Data Out), the digital video signal is outputted through the TFT 101 without modification.

The above operation is conducted in succession for one horizontal period. Respective signals which are outputted to the output terminal (Data Out) and the inverting output terminal (Data Out_b) are held in the capacitor means 104 and 105 until a retrace period is started.

When the sampling pulse (Samp. Pulse) becomes an L level to elapse a sampling period, the TFTs 101 and 102 are turned OFF. In other words, in the latch circuit of the present invention as shown in FIG. 1, only when the sampling pulse is inputted and the digital video signal is an H level, a current path is produced through VDD, TFT 102, TFT 103, and vSS.

Here, amplitude of the output signal produced in the output terminal (Data Out) side is in a range of (VDD−VthN) to VSS because of the influence of a threshold value of the TFT 101. Similarly, an amplitude of the output signal produced in the inverting output terminal (Data Out_b) side is in a range of (VDD−VthN) to VSS because of the influence of a threshold value of the TFT 102. However, after that, when a buffer is provided in a subsequent stage of the latch circuit, the amplitude is compensated by using a bootstrap. Thus, a problem is not almost caused.

Hereinafter, embodiments of the present invention will be described.

Embodiment 1

Figure 11:
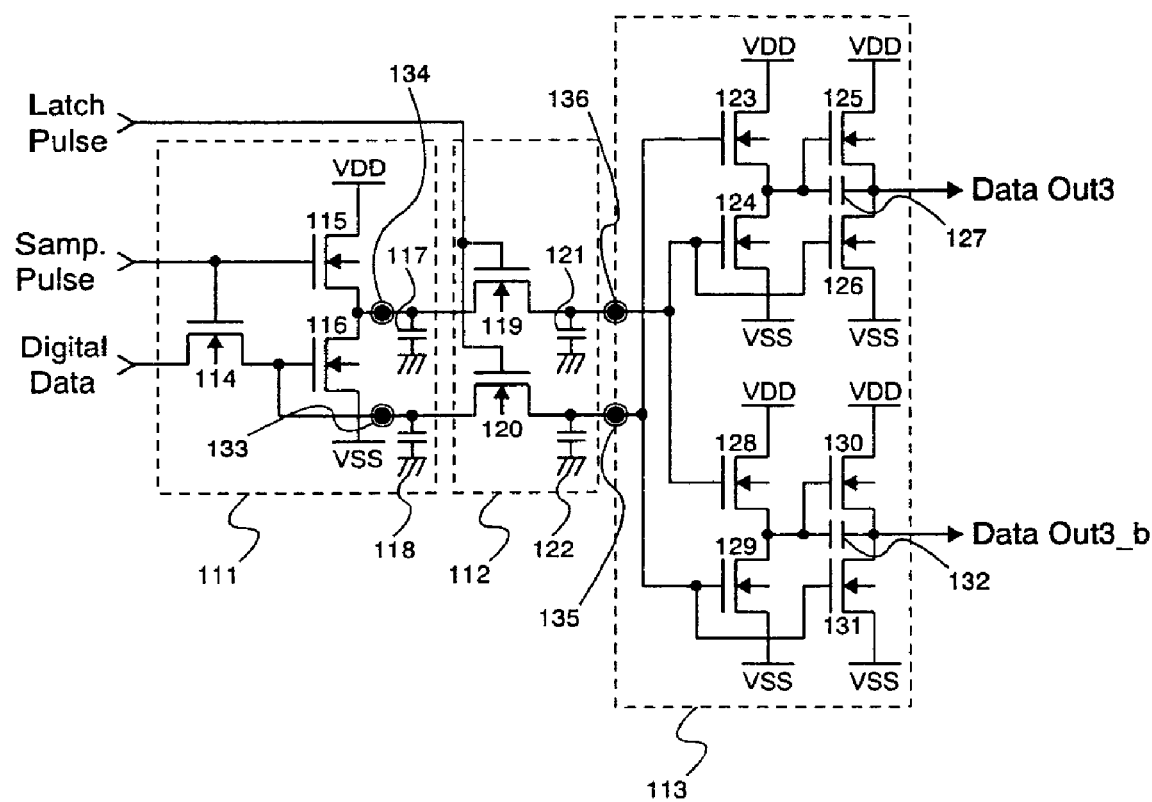
FIG. 11 is a diagram showing the example of the structure of a latch circuit of the present invention.

FIG. 11 shows an example in which the circuit having the configuration described in the embodiment mode is used as a first latch circuit and further a second latch circuit and a buffer are provided. A first latch circuit 111 has TFTs 114 to 116 and capacitor means 117 and 118. A second latch circuit 112 has TFTs 119 and 120 and capacitor means 121 and 122. A buffer circuit 113 has an inverter composed of TFTs 123 to 126 and a capacitor means 127 and an inverter composed of TFTs 128 to 131 and a capacitor means 132.

When a latch pulse (Latch Pulse) is inputted during a retrace period after sampling corresponding to one horizontal period is completed, the TFTs 119 and 120 in the second latch circuit 112 are turned ON, and signals held in the capacitor means 117 and 118 of the first latch circuit 111 are written into the capacitor means 121 and 122 of the second latch circuit 112.

When the sampling pulse (Samp. Pulse) becomes an L level to elapse a sampling period, the TFTs 114 and 115 are turned OFF and then the TFT 116 is turned OFF. Thus, the input electrodes of the TFTs 119 and 120 become a floating state. Subsequently, when a latch pulse (Latch Pulse) is inputted, the TFTs 119 and 120 are turned ON and signals are written into the capacitor means 121 and 122. At this time, a current supply source is not connected with the input electrodes of the TFTs 119 and 120. Thus, the above operation is conducted by only transfer of charges in the capacitor means 117, 118, 121, and 122. As a result, in order to sufficiently conduct writing into the capacitor means 121 and 122, it is desirable that the capacitor means 117 and 118 each having a large capacitance are designed.

Then, output signals from the second latch circuit 112 are inputted to the buffer circuit 113. In the buffer circuit 113, two inverters are located in pairs. Here, only an operation of one inverter which is composed of the TFTs 123 to 126 and the capacitor means 127 will be described.

When one output (Data Out2) 135 of the second latch circuit 112 is an H level, a signal having an H level is inputted to the gate electrode of the TFT 123 and it is turned ON. On the other hand, another output (Data Out2_b) 136 having an L level from the second latch circuit 112 is inputted to the gate electrodes of the TFTs 124 and 126 and they are turned OFF. Thus, a potential of the gate electrode of the TFT 125 is risen.

Now, a potential of the gate electrode of the TFT 123 is (VDD−VthN). Thus, when the potential of the gate electrode of the TFT 125 reaches (VDD−VthN), a voltage between the gate and the source of the TFT 123 falls below its threshold value and it is turned OFF. As a result, the gate electrode of the TFT 125 becomes temporarily in a floating state at this time.

Here, if VthN<(VDD−VthN), the TFT 125 is turned ON and an H level is produced in an output terminal (Data Out3) of the buffer circuit 113, thereby rising the potential of the output terminal. Further, the capacitor means 127 is provided between the gate electrode and the output electrode of the TFT 125, and the gate electrode thereof is in a floating state now. Therefore, with rising the potential of the output terminal (Data Out3), the potential of the gate electrode of the TFT 125 is further risen by capacitive coupling.

Thus, when the potential of the gate electrode of the TFT 125 becomes higher than (VDD+VthN), the H level is produced in the output terminal and its potential becomes equal to VDD without the influence of a threshold value of the TFT 125.

On the other hand, when one output (Data Out2) 135 of the second latch circuit 112 is an L level, a signal having an L level is inputted to the gate electrode of the TFT 123 and it is turned OFF. Another output (Data Out2_b) 136 having an H level from the second latch circuit 112 is inputted to the gate electrodes of the TFTs 124 and 126 and they are turned ON. Thus, the potential of the gate electrode of the TFT 125 becomes an L level and it is turned OFF, thereby producing an L level in the output terminal (Data Out3).

With respect to the inverter which is composed of the TFTs 128 to 131 and the capacitor means 132, the same operation is conducted. Thus, when an H level is produced in one output terminal (Data Out3), an L level is produced in another output terminal (Data Out3_b).

In the latch circuits described in this embodiment, an attenuation of an amplitude corresponding to the threshold value of the TFT is caused between the first latch circuit and the second latch circuit. Thus, it is necessary to increase a power source voltage up to a point. Therefore, a configuration in which amplitude compensation is conducted for the output of the first latch circuit through the buffer temporarily may be used.

Embodiment 2

This embodiment gives a description on a method of manufacturing TFTs for driving circuit provided in a pixel portion and in the periphery of the pixel potion formed on the same substrate. A method of manufacturing a liquid crystal display device is described as an example, however, the present invention is not limited to a liquid crystal display device as above mentioned.

Figure 7A:
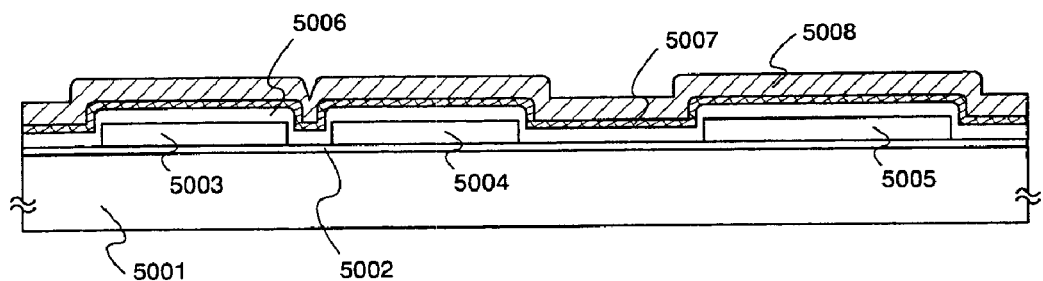
FIG. 7 is a diagram showing the example of manufacturing steps of a display device.

First, as shown in FIG. 7A, a base film 5002 is formed from an insulating film such as a silicon oxide film, a silicon nitride film, and a silicon oxynitride film on a glass substrate 5001. The substrate 5001 is formed of barium borosilicate glass typical example of which is Corning # 7059 glass or Corning #1737 glass (product of Corning Incorporated), or of aluminoborosilicate glass. The base film 5002 is, for example, (not shown) a laminate of a silicon oxynitride film that is formed from $SiH_4$, $NH_3$, and $N_2O$ by plasma CVD to a thickness of 10 to 200 nm (preferably 50 to 100 nm) and a silicon oxynitride hydride film formed from $SiH_4$ and $N_2O$ by plasma CVD to a thickness of 50 to 200 nm (preferably 100 to 150 nm).

A semiconductor film having an amorphous structure is crystallized by laser crystallization or a known thermal crystallization method to form a crystalline semiconductor film. The crystalline semiconductor film makes island-like semiconductor layers 5003 to 5005. The island-like semiconductor layers 5003 to 5005 each have a thickness of 25 to 80 nm (preferably 30 to 60 nm). No limitation is put on the choice of material of the crystalline semiconductor film but it is preferable to use silicon or a silicon germanium (SiGe) alloy.

When the crystalline semiconductor film is formed by laser crystallization, a pulse oscillation-type or continuous wave excimer laser, YAG laser, or $YVO_4$ laser is used. Laser light emitted from a laser as those given in the above is desirably collected into a linear beam by an optical system before irradiating the semiconductor film. Conditions of crystallization are set suitably by an operator. However, if an excimer laser is used, the pulse oscillation frequency is set to 30 Hz and the laser energy density is set to 100 to 400 $mJ/cm^2$ (typically 200 to 300 $mJ/cm^2$). If a YAG laser is used, second harmonic thereof is employed and the pulse oscillation frequency is set to 1 to 10 kHz while setting the laser energy density to 300 to 600 $mJ/cm^2$ (typically 350 to 500 $mJ/cm^2$). The laser light is collected into a linear beam having a width of 100 to 1000 μm, for example, 400 m, to irradiate the entire substrate. The substrate is irradiated with the linear laser light with the beams overlapping each other at an overlap ratio of 80 to 98%.

Next, a gate insulating film 5006 is formed so as to cover the island-like semiconductor layers 5003 to 5005. The gate insulating film 5006 is formed from an insulating film containing silicon by plasma CVD or sputtering to a thickness of 40 to 150 nm. In this embodiment, a silicon oxynitride film having a thickness of 120 nm is used. Needless to say, the gate insulating film is not limited to a silicon oxynitride film but may be a single layer or a laminate of other insulating films containing silicon. For example, if a silicon oxide film is used for the gate insulating film, the film is formed by plasma CVD in which TEOS (tetraethyl orthosilicate) is mixed with $O_2$ and the reaction pressure is set to 40 Pa, the substrate temperature to 300 to 400° C., the frequency is set high to 13.56 MHz, and the power density is set to 0.5 to 0.8 $W/cm^2$ for electric discharge. The silicon oxide film thus formed can provide the gate insulating film with excellent characteristics when it is subjected to subsequent thermal annealing at 400 to 500° C.

On the gate insulating film 5006, a first conductive film 5007 and a second conductive film 5008 for forming gate electrodes are formed. In this embodiment, the first conductive film 5007 is a Ta film with a thickness of 50 to 100 nm and the second conductive film 5009 is a W film with a thickness of 100 to 300 nm (FIG. 7A).

The Ta film is formed by sputtering in which Ta as a target is sputtered with Ar. In this case, an appropriate amount of Xe or Kr is added to Ar to ease the internal stress of the Ta film and thus prevent the Ta film from peeling off. The resistivity of a Ta film in α phase is about 20 μΩcm and is usable for a gate electrode. On the other hand, the resistivity of a Ta film in β phase is about 180 μΩcm and is not suitable for a gate electrode. A Ta film in α phase can readily be obtained when a base with a thickness of about 10 to 50 nm is formed from tantalum nitride (TaN) that has a crystal structure approximate to that of the α phase Ta film.

The W film is formed by sputtering with W as a target. Alternatively, the W film may be formed by thermal CVD using tungsten hexafluoride ($WF_6$). In either case, the W film has to have a low resistivity in order to use the W film as a gate electrode. A desirable resistivity of the W film is 20 μΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9999% is used and a great care is taken not to allow impurities in the air to mix in the W film being formed. As a result, the W film can have a resistivity of 9 to 20 μΩcm.

Although the first conductive film 5007 is a Ta film and the second conductive film 5008 is a W film in this embodiment, there is no particular limitation. The conductive films may be formed of any element selected from the group consisting of Ta, W, Mo, Al, and Cu, or of an alloy material or compound material mainly containing the elements listed above. A semiconductor film, typically a polycrystalline silicon film doped with an impurity element such as phosphorus, may be used instead. Other desirable combinations of materials for the first and second conductive films than the one shown in this embodiment include: tantalum nitride (TaN) for the first conductive film 5007 and W for the second conductive film 5008; tantalum nitride (TaN) for the first conductive film 5007 and Al for the second conductive film 5008; and tantalum nitride (TaN) for the first conductive film 5007 and Cu for the second conductive film 5008.

Next, a resist mask 5009 is formed to carry out first etching treatment for forming electrodes and wiring lines. In this embodiment, ICP (inductively coupled plasma) etching is employed in which $CF_4$ and $Cl_2$ are mixed as etching gas and an RF (13.56 MHz) power of 500 W is given to a coiled electrode at a pressure of 1 Pa to generate plasma. The substrate side (sample stage) also receives an RF (13.56 MHz) power of 100 W so that a substantially negative self-bias voltage is applied. When the mixture of $CF_4$ and $Cl_2$ is used, the W film and the Ta film are etched to the same degree.

Figure 7B:
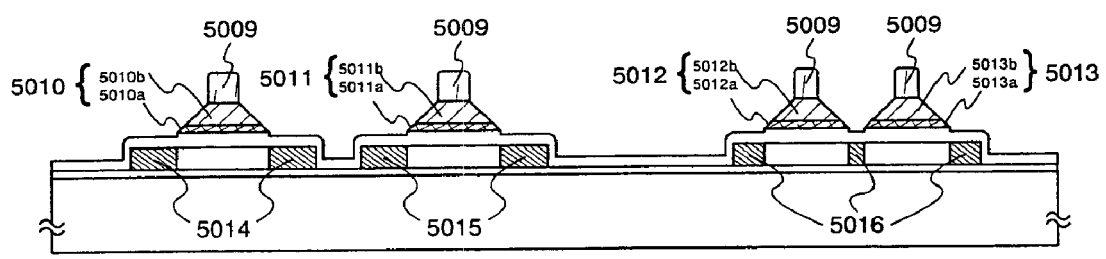

Under the above etching conditions, if the resist mask is properly shaped, the first conductive film and the second conductive film are tapered around the edges by the effect of the bias voltage applied to the substrate side. The angle of the tapered portions is 15° to 45°. In order to etch the conductive films without leaving any residue on the gate insulating film, the etching time is prolonged by about 10 to 20%. The selective ratio of the W film to the silicon oxynitride film is 2 to 4 (typically 3), and therefore a region where the silicon oxynitride film is exposed is etched by about 20 to 50 nm by the over-etching treatment. In this way, first shape conductive layers 5010 to 5013 comprising first conductive layers 5010a to 5013a and second conductive layers 5010b to 5013b are formed from the first conductive film and the second conductive film through the first etching treatment. At this point, regions of the gate insulating film 5006 that are not covered with the first shape conductive layers 5010 to 5013 are etched and thinned by about 20 to 50 nm. (FIG. 7B) First doping treatment is conducted next for doping of an impurity element that gives the n-type conductivity (FIG. 7B). Ion doping or ion implanting is employed. In ion doping, the dose is set to $1 \times 10^{13}$ to $5 \times 10^{14}$ atoms/cm$^2$ and the acceleration voltage is set to 60 to 100 keV. The impurity element that gives the n-type conductivity is an element belonging to Group 15, typically, phosphorus (P) or arsenic (As). Here, phosphorus (P) is used. In this case, the conductive layers 5010 to 5013 serve as masks against the impurity element that gives the n-type conductivity, and first impurity regions 5014 to 5016 are formed in a self-aligning manner. The first impurity regions 5014 to 5016 each contain the impurity element that gives the n-type conductivity in a concentration of $1 \times 10^{20}$ to $1 \times 10^{21}$ atoms/cm$^3$.

Figure 7C:
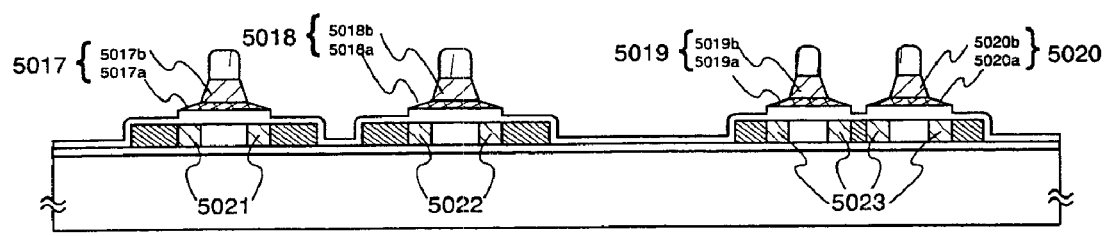

Next, as shown in FIG. 7C, a second etching process is performed. The ICP etching method is similarly used in which $CF_4$, $Cl_2$, and $O_2$ are mixed as the etching gases, and an RF power of 500 W is applied to a coil type electrode under a pressure of 1 Pa to generate plasma. An RF power of 50 W is applied to the side of the substrate (sample stage), and a low self bias voltage as compared with the first etching process is applied thereto. In accordance with the conditions, the W film as the second conductive layer is anisotropically etched, and the Ta film as the first conductive layer is anisotropically etched at an etching rate lower than the W film to form second shape conductive layers 5017 to 5020 (first conductive layers 5017a to 5020a and second conductive layers 5017b to 5020b). Reference numeral 5006 designates a gate insulating film, and regions which are not covered with the second shape conductive layers 5017 to 5020 are etched into a film thickness of about 20 to 50 nm, to for thin regions.

The reaction of the W film and the Ta film to etching by the mixture gas of $CF_4$ and $Cl_2$ can be deduced from the vapor pressure of radical or ion species generated and of reaction products. Comparing the vapor pressure among fluorides and chlorides of W and Ta, $WF_6$ that is a fluoride of W has an extremely high vapor pressure while the others, namely, $WCl_5$, $TaF_5$, and $TaCl_5$ have a vapor pressure of about the same degree. Accordingly, the W film and the Ta film are both etched with the mixture gas of $CF_4$ and $Cl_2$. However, when an appropriate amount of $O_2$ is added to this mixture gas, $CF_4$ and $O_2$ react to each other to be changed into CO and F, generating a large amount of F radicals or F ions. As a result, the W film whose fluoride has a high vapor pressure is etched at an increased etching rate. On the other hand, the etching rate of the Ta film is not increased much when F ions are increased in number. Since Ta is more easily oxidized than W, the addition of $O_2$ results in oxidization of the surface of the Ta film. The oxide of Ta does not react with fluorine or chlorine and therefore the etching rate of the Ta film is reduced further. Thus a difference in etching rate is introduced between the W film and the Ta film, so that the etching rate of the W film is set faster than the etching rate of the Ta film.

Then second doping treatment is conducted (FIG. 7C). In the second doping treatment, the film is doped with an impurity element that gives the n-type conductivity in a dose smaller than in the first doping treatment and at a high acceleration voltage. For example, the acceleration voltage is set to 70 to 120 keV and the dose is set to $1 \times 10^{13}$ atoms/cm$^2$ to form new impurity regions inside the first impurity regions that are formed in the island-like semiconductor layers in FIG. 7B. While the second conductive layers 5017b to 5020b are used as masks against the impurity element, regions under the first conductive layers 5017a to 5020a are also doped with the impurity element. Thus formed are second impurity regions 5021 to 5023 overlapping the first conductive layer.

Figure 8A:
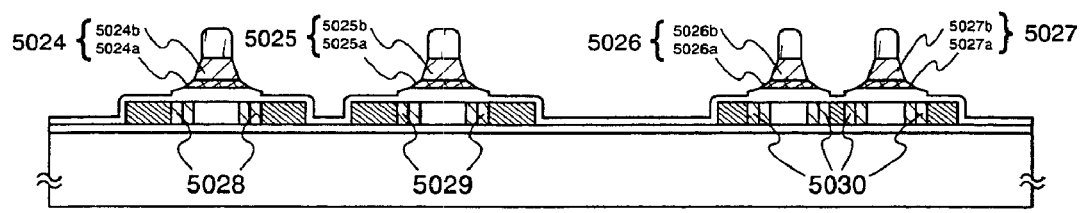
FIG. 8 is a diagram showing the example of manufacturing steps of a display device.

Next, as shown in FIG. 8A, a third etching process is performed. In this embodiment, an ICP etching device is employed and $Cl_2$ is used as etching gas. Etching is conducted for 70 seconds, setting the flow rate of $Cl_2$ to 60 (sccm), and an RF power of 350 W is applied to a coil type electrode under a pressure of 1 Pa to generate plasma. An RF power is also applied to the side of the substrate (sample stage) so that a substantially negative self-bias voltage is applied. Through the third etching process, the first conductive layer is etched to reduce the region, thereby third shape conductive layers 5024 to 5027 (first conductive layers 5024a to 5027a and second conductive layers 5024b to 5027b) are formed. A part of second impurity regions 5021 to 5023 is the third impurity region 5028b to 5030b that are not covered with the first conductive layer.

Through the steps above, the impurity regions are formed in the respective island-like semiconductor layers. The third shape conductive layers 5024 to 5026 overlapping the island-like semiconductor layers function as gate electrodes of TFTs.

The impurity elements used to dope the island-like semiconductor layers in order to control the conductivity types are activated. The activation step is carried out by thermal annealing using an annealing furnace. Other activation adoptable methods include laser annealing and rapid thermal annealing (RTA). The thermal annealing is conducted in a nitrogen atmosphere with an oxygen concentration of 1 ppm or less, preferably 0.1 ppm or less, at 400 to 700° C., typically 500 to 600° C. In this embodiment, the substrate is subjected to heat treatment at 500° C. for four hours. However, if the wiring line material used for the third shape conductive layers 5024 to 5027 are weak against heat, the activation is desirably made after an interlayer insulating film (mainly containing silicon) is formed in order to protect the wiring lines and others.

Another heat treatment is conducted in an atmosphere containing 3 to 100% hydrogen at 300 to 450° C. for one to twelve hours, thereby hydrogenating the island-like semiconductor layers. The hydrogenation steps are to terminate dangling bonds in the semiconductor layers using thermally excited hydrogen. Alternatively, plasma hydrogenation (using hydrogen that is excited by plasma) may be employed.

Figure 8B:
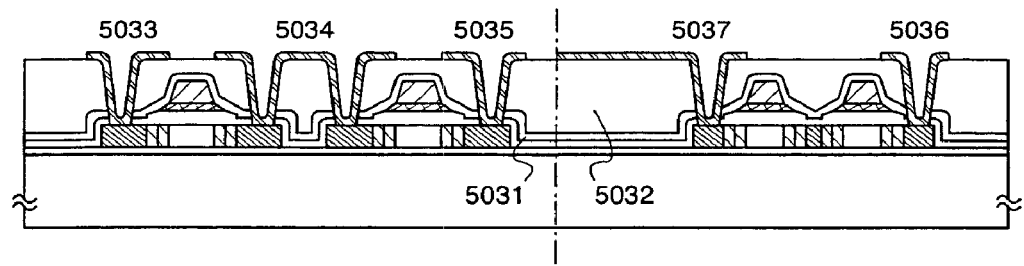

As shown in FIG. 8B, a first interlayer insulating film 5031 is formed next from a silicon oxynitride film with a thickness of 100 to 200 nm. A second interlayer insulating film 5032 is formed thereon from an organic insulating material. Thereafter, contact holes are formed corresponding to the first interlayer insulating film 5031, the second interlayer insulating film 5032, and the gate insulating film 5006. A film made of wiring lines material is formed, whereby each wiring lines 5033 to 5036 and a pixel electrode 5037 are formed by patterning.

The second interlayer insulating film 5032 is a film made of an organic resin. Examples of the usable organic resin includes polyimide, polyamide, acrylic resin, and BCB (benzocyclobutene). Since planarization is a significant aspect of the role of the second interlayer insulating film 5032, acrylic resin that can level the surface well is particularly preferable. In this embodiment, the acrylic film is thick enough to eliminate the level differences caused by the TFTs. An appropriate thickness of the film is 1 to 5 μm (preferably 2 to 4 μm).

The contact holes are formed by dry etching or wet etching, and include contact holes reaching the impurity regions 5014 to 5016 having the n-type conductivity, the source signal lines (not shown), the gate signal lines (not shown), a power supply line (not shown), and gate electrodes 5024 to 5027 (not shown) respectively.

Figure 8C:
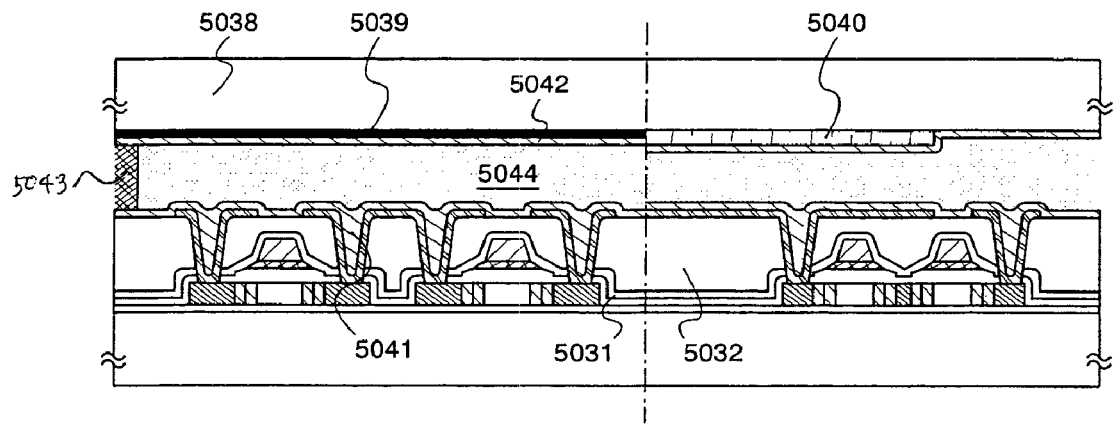

Further, a lamination film of a three layer structure, in which a 100 nm thick Ti film, a 300 nm thick Al film containing Ti, and a 150 nm thick Ti film are formed in succession by sputtering the wirings 5033 to 5036. Of course, other conductive films may be used. As to the pixel electrode 5037, in a case of that the display device is a reflect type, is formed by a material in high reflectivity. On the other hand, in a case of that the display device is a transmission type, the pixel electrode 5037 is formed by using a material like Indium Tin Oxide (ITO) or the like that has transparent conductivity. The state completed as shown FIG. 8 is referred to as the active matrix substrate.

An opposing substrate 5038 is prepared next. A light shielding film is formed on the opposing substrate 5038. The light shielding film is formed of a material such as chrome (Cr) into a thickness of 100 to 200 nm.

On the other side, an opposing electrode 5040 is formed in the pixel portion. The opposing electrode is formed by using a transparent conductive material such as ITO. Further, it is preferable that the film thickness of the opposing electrode be from 100 to 120 nm in order to maintain a high transmittivity of visible light.

Orientation films 5041 and 5042 are formed in the active matrix substrate and the opposing substrate. It is preferable that the film thickness of the orientation films 5041 and 5042 are from 30 to 80 nm. Furthermore, materials such as SE7792, for example, manufactured by Nissan Chemical Industries, Ltd., can be used for the orientation films. If an orientation film having a high pre-tilt angle is used, then the generation of disclination can be controlled at the same time as driving the liquid crystal display device by an active matrix method.

The orientation films 5041 and 5042 undergo a rubbing process next. It is preferable that the rubbing direction show a counterclockwise TN (twisted nematic) orientation when the liquid crystal display device is complete.

Although not shown in particular in the figures for Embodiment 2, it is also possible to increase the uniformity of a cell gap by distributing spacers within the pixels or by patterning. A photosensitive resin film is formed and patterned in Embodiment 2, thus forming spacers having a height of 4.0 μm.

The active matrix substrate and the opposing substrate are then bonded by using a sealant 5043. The thermosetting sealant XN-21S manufactured by Mitsui Chemicals is used as the sealant. A filler is mixed into the sealant. Note that the height of the filler is set to 4.0 μm. After the sealant is hardened, the active matrix substrate and the opposing substrate are sectioned simultaneously into predetermined sizes.

Liquid crystals 5044 are injected next. Considering high speed response characteristics and the like, it is preferable to use a low viscosity liquid crystal material for the liquid crystals. A nematic liquid crystal material having an easily controlled orientation is used in Embodiment 2. High response speed ferroelectric liquid crystals and anti-ferroelectric liquid crystals may of course also be used.

In injection port is sealed by using a UV hardening resin or the like after liquid crystal injection is complete. A polarizing sheet is then attached by a known method. Lastly, a connector (flexible printed circuit: FCP) for connecting the elements formed on the substrate, or terminals pulled out from the circuits with external signal terminals is attached, completing a manufactured product (see FIG. 8C). This state, one capable of being shipped as a finished product, is referred to as a liquid crystal display device within this specification.

Further, the number of photomasks necessary for manufacturing the active matrix substrate can be kept to four (island shape semiconductor layer pattern, first wiring pattern (gate wirings, island shape source wirings, capacitor wirings), contact hole pattern, and second wiring pattern (including pixel electrodes and connection electrodes)) in accordance with the processes disclosed in Embodiment 2. As a result, processing can be shortened, and this contributes to a reduction in manufacturing costs and to an increase in yield.

Figure 17A:
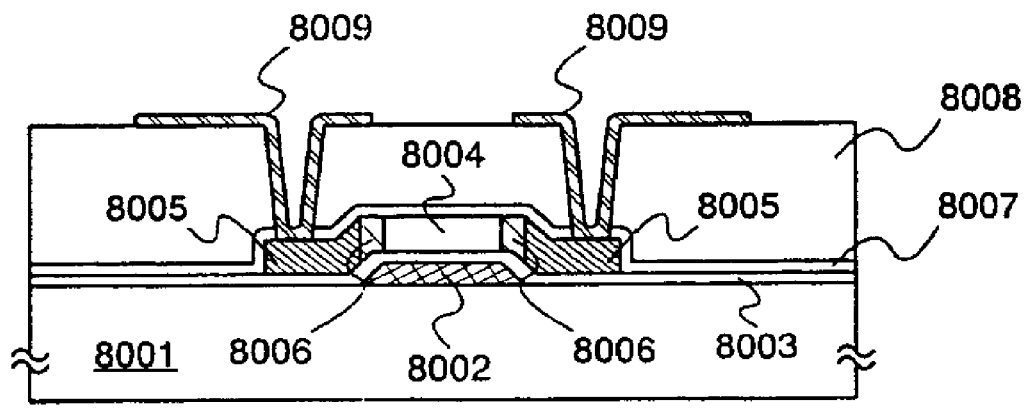
FIG. 17 is a diagram illustrating the cross-sectional structure of a bottom gate TFT and a dual gate TFT.
Figure 17B:
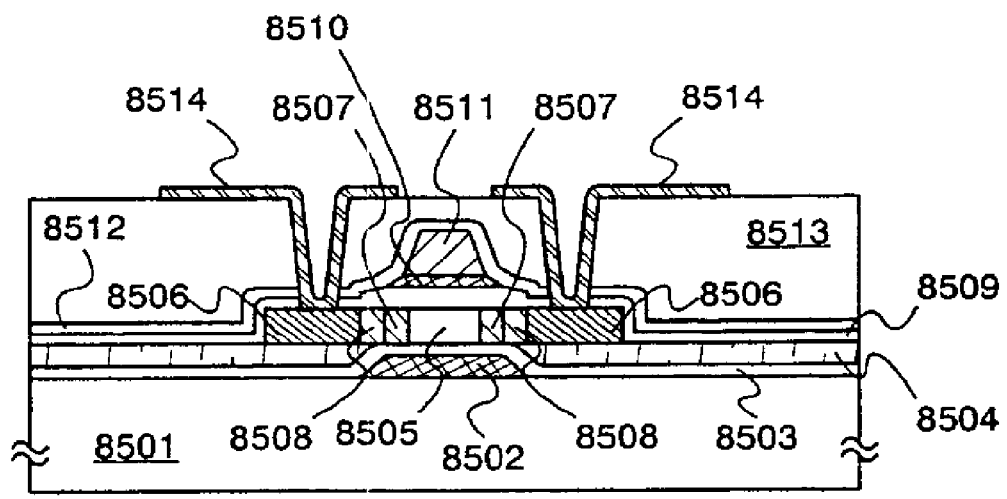

In addition, the top gate type TFT is described as an example of a TFT model. Besides, a bottom gate TFT forming a gate electrode at the bottom of the active layer as shown in FIG. 17A, or a dual gate TFT having gate electrodes at top and bottom in order to put the active layer between the gate electrodes can be used to implement Embodiment 2.

Embodiment 3

In this embodiment, an example in which a display device is actually manufactured using the circuits described in Embodiment Mode and Embodiment 1 will be described.

Figure 2A:
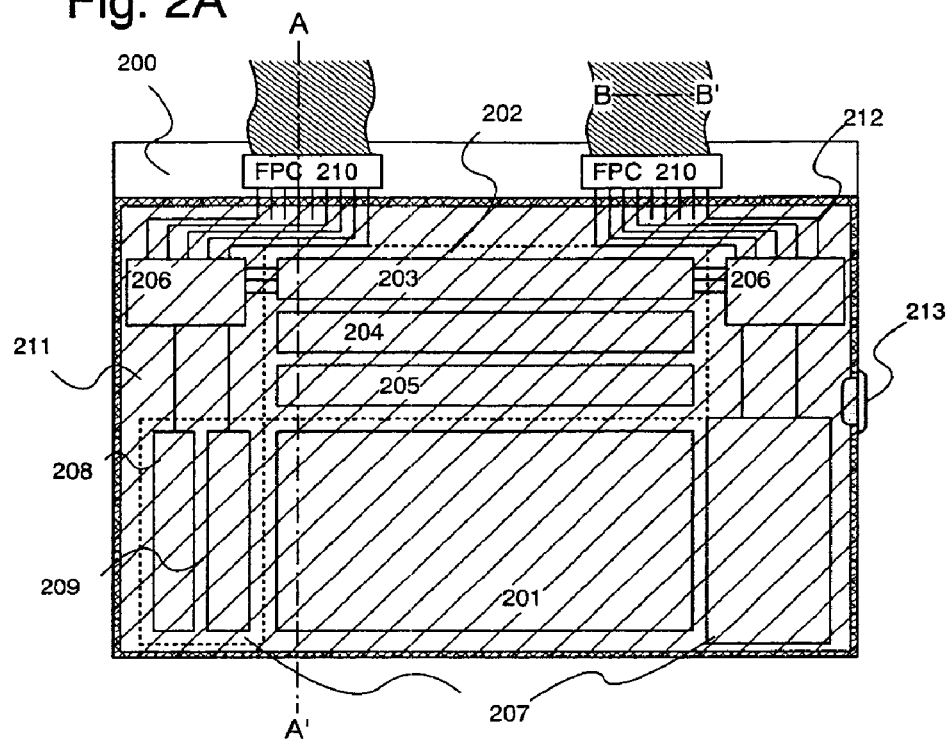
FIG. 2 is a diagram illustrating an outline and the cross-sectional view of a display device.
Figure 2B:
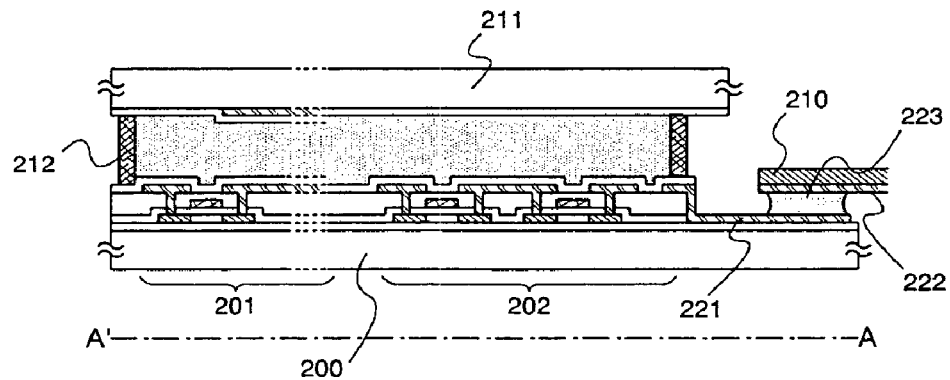
Figure 2C:
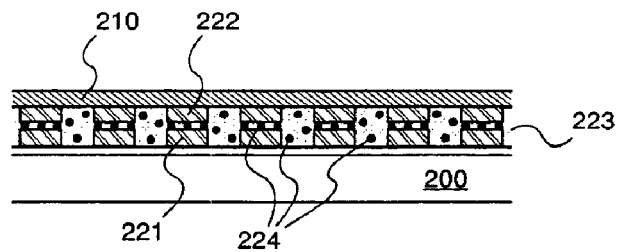

FIGS. 2A to 2C are schematic views of a display device. A pixel portion 201 is located on a central portion of the substrate 200. A source signal line driver circuit 202 for controlling source signal lines and gate signal line driver circuits 207 for controlling gate signal lines are located in the vicinity of the pixel portion 201. In FIG. 2A, the gate signal line driver circuits 207 are symmetrically located in both sides of the pixel portion 201. It may be located in only one side of the pixel portion 201.

Signals for operating the source signal line driver circuit 202 and the gate signal line driver circuits 207 which are inputted from an external circuit are inputted through FPCs 210. In this embodiment, the respective signals inputted through the FPCs 210 have small voltage amplitude. Thus, voltage amplitude conversion is conducted for the signals by a level shifter 206 and then they are inputted to the source signal line driver circuit 202 and the gate signal line driver circuits 207.

FIG. 2B is a cross sectional view taken along the broken line A-A' of FIG. 2A. The pixel portion 201, the source signal line driver circuit 202, and the gate signal line driver circuits (not shown) are formed on the substrate 200. The substrate 200 and a counter substrate 211 are bonded to each other through a seal agent 212 and a liquid crystal is injected into a gap between the substrates. After the injection of the liquid crystal, an inlet is sealed by a sealing agent 213 as shown in FIG. 2A.

A lead wiring 221 is electrically connected with an FPC side wiring 222 of the FPC 210 through an anisotropic conductive film 223. As shown in FIG. 2C, the anisotropic conductive film 223 includes conductive fillers 224. Thus, when the substrate 200 and the FPC 210 are bonded to each other by thermocompression bonding, the lead wiring 221 on the substrate 200 is electrically connected with the FPC side wiring 222 of the FPC 210 through the conductive fillers 224.

Figure 3:
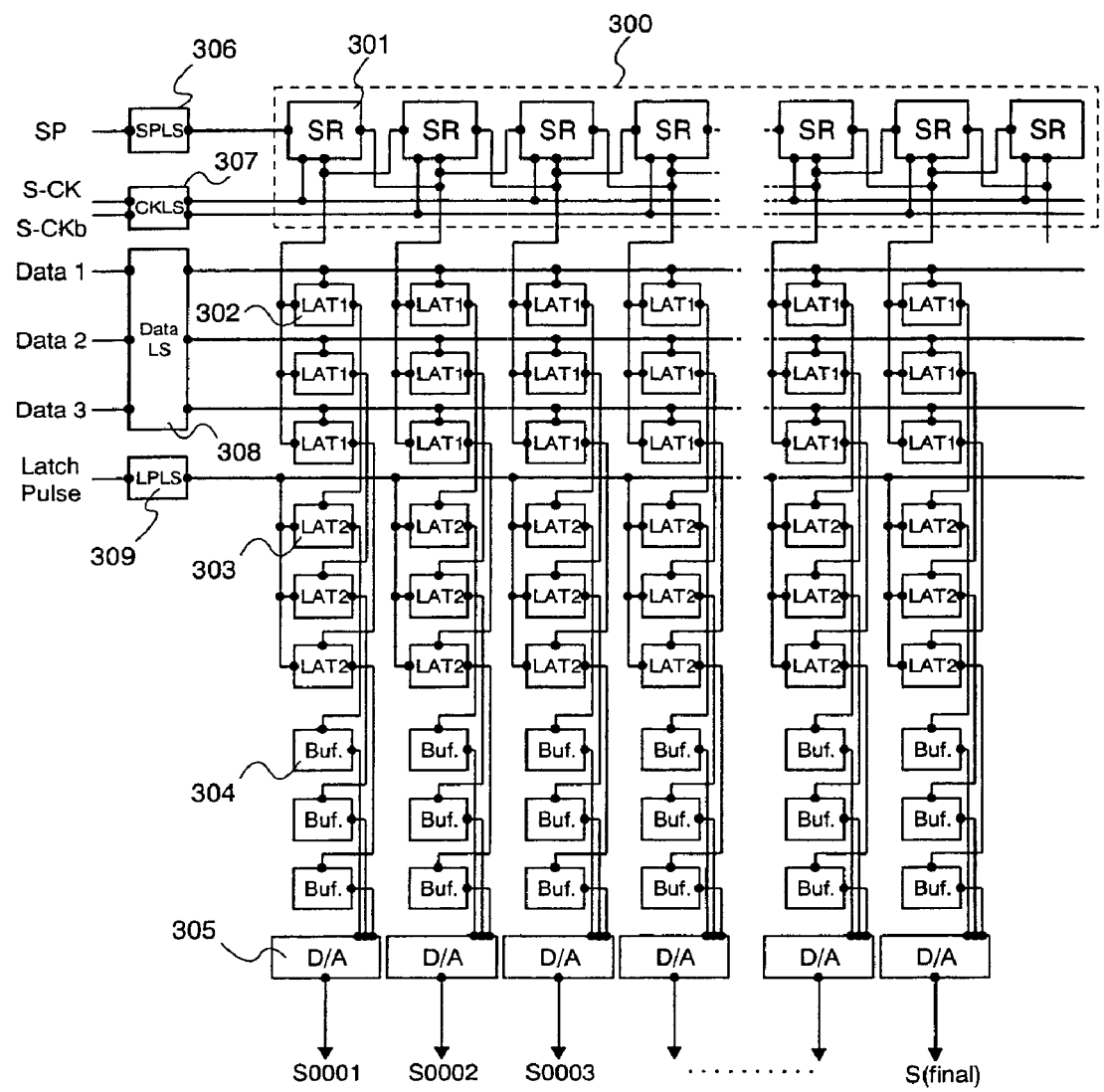
FIG. 3 is a diagram showing the structure of a source signal driver circuit formed by using a latch circuit of the present invention.

FIG. 3 shows a configuration of the source signal line driver circuit 202. A shift register indicated by a dotted frame 300 is composed of plural stages of pulse output circuits 301 for outputting sampling pulses in accordance with a clock signal and a start pulse. The circuits shown in FIG. 11 in Embodiment 1 are used for first latch circuits 302, second latch circuits 303, and buffer circuits 304. 3 bits of digital video signals (Data1 to Data3) are inputted to the source signal line driver circuit shown in FIG. 3. Thus, the first latch circuits 302, the second latch circuits 303, and the buffer circuits 304 each are located in groups of three in parallel, and simultaneously holding of the 3 bits of digital video signals is performed in accordance with a sampling pulse outputted from one pulse output circuit.

A D/A converting circuits 305 are not particularly shown in this specification. Any conventionally used type such as a resistance division type or a capacitor type may be used.

The 3 bits of digital video signals are converted into 23 gray scales of analog video signals by the D/A converting circuits 305 and supplied to the respective source signal lines (S0001 to S(final)).

Note that signals inputted from an external circuit are outputted from an integrated circuit (IC). Thus, with reducing a voltage in recent years, each of the signals is a signal having low voltage amplitude of about 3 V to 5 V in many cases. Therefore, the signals are converted into signals each having high voltage amplitude by level shifters 306 to 309 and then inputted to the driver circuit.

Figure 4:
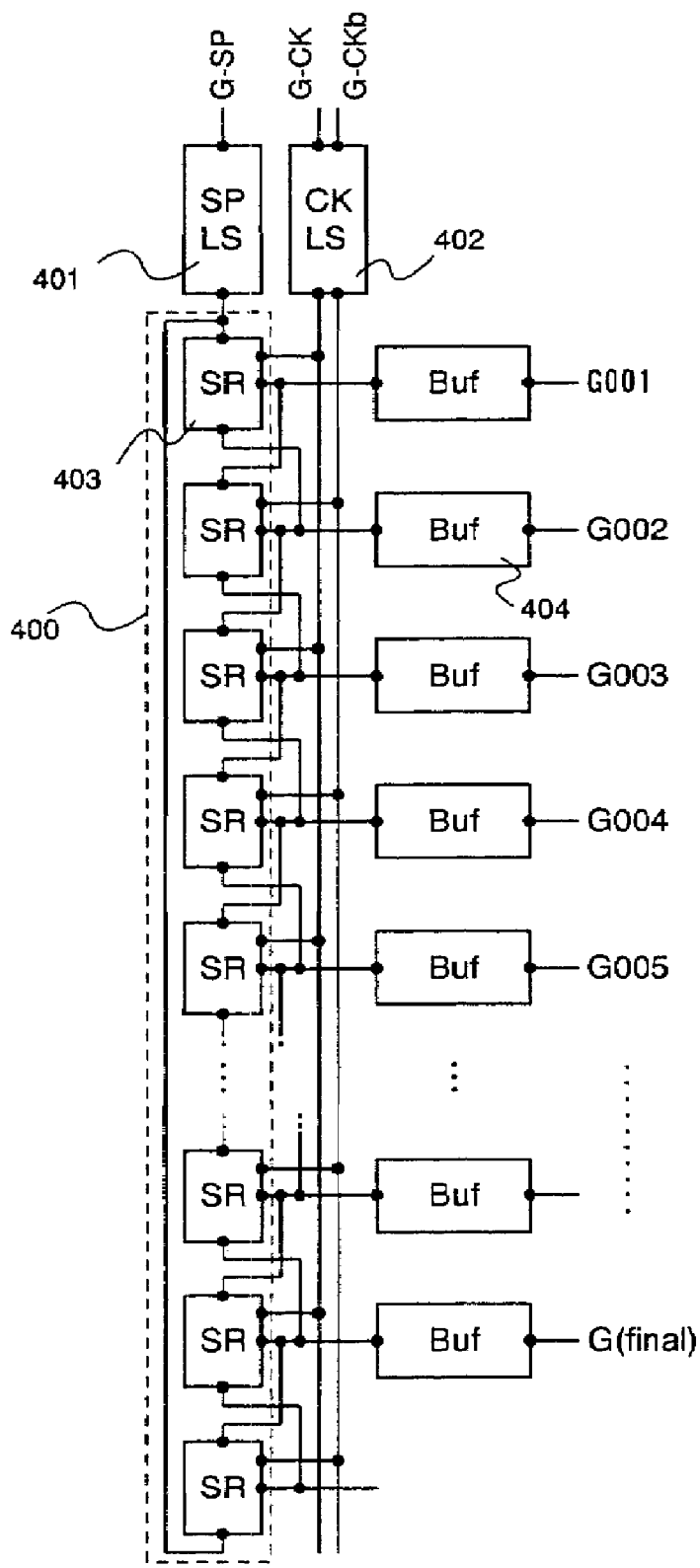
FIG. 4 is a diagram illustrating the structure of a gate signal driver circuit.
Figure 5A:
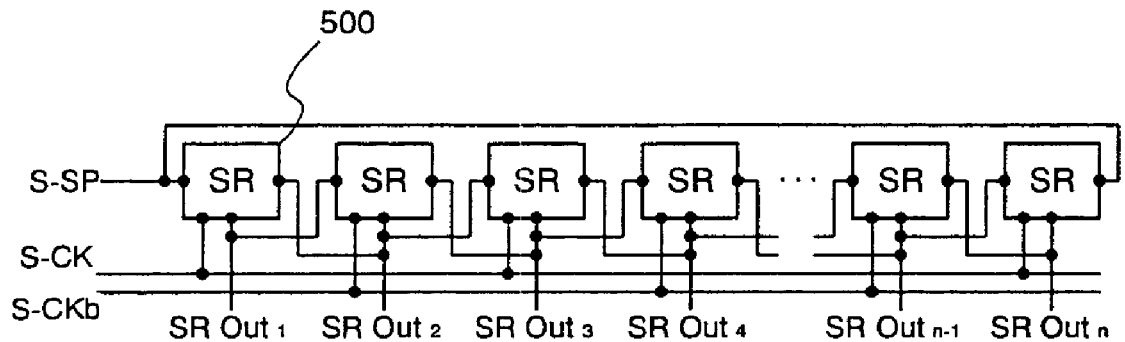
FIG. 5 is a diagram illustrating a shift resistor formed by using single polarity TFT.
Figure 5B:
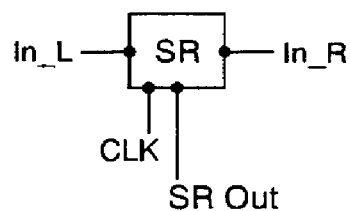
Figure 5B:
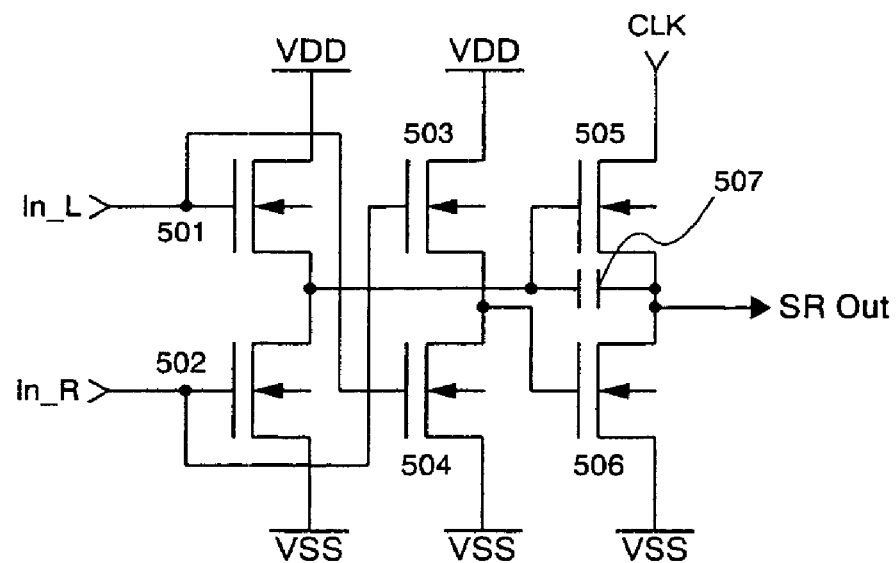
Figure 6A:
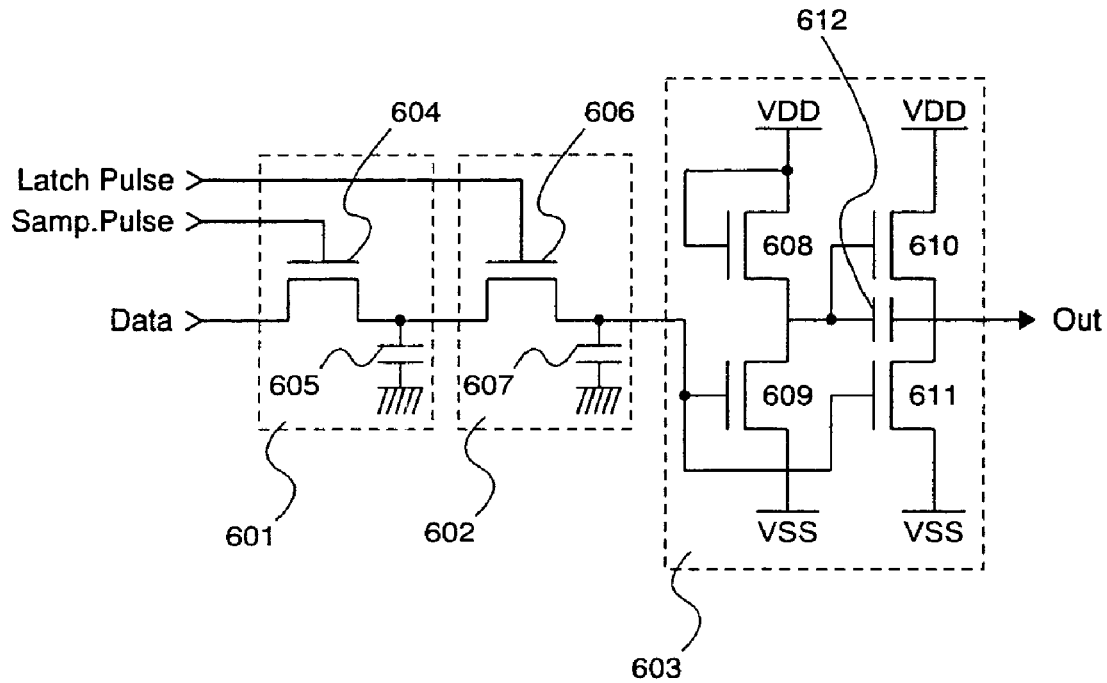
FIG. 6 is a diagram illustrating a latch circuit and a buffer formed by using a single polarity TFT.
Figure 6B:
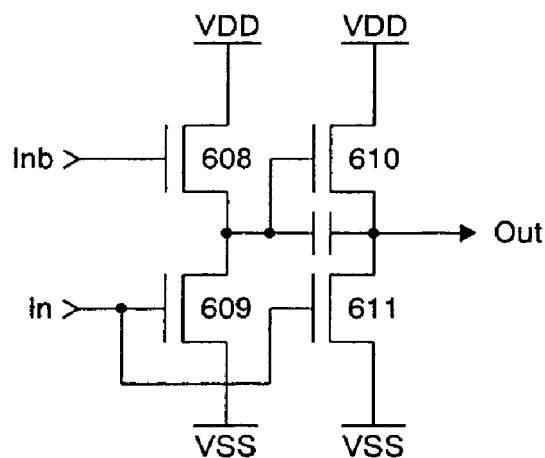

FIG. 4 shows a configuration of the gate signal line driver circuit 207. A shift register indicated by a dotted frame 400 is composed of plural stages of pulse output circuits 403 for outputting a gate signal line selection pulse in accordance with a clock signal and a start pulse. When a load of the gate signal line is large, that is, when the gate signal line selection pulse outputted from the shift register does not has drive power capable of directly switching a potential of the gate signal line to an H level or an L level, it is necessary to use buffers 404.

Note that signals inputted from an external circuit are outputted from an integrated circuit (IC). Thus, with reducing a voltage in recent years, each of the signals is a signal having low voltage amplitude of about 3 V to 5 V in many cases. Therefore, the signals are converted into signals each having high voltage amplitude by level shifters 401 and 402 and then inputted to the driver circuit.

Embodiment 4

The steps in Embodiment 2 are described as the example of the case where the pixels and the peripheral driver circuits are composed of the N-channel TFTs. However, according to the present invention, an embodiment using a P-channel TFT is also possible.

In the case of the N-channel TFT, in order to suppress hot carrier deterioration and the like, an impurity region which is called an overlap region is provided in a region overlapped with the gate electrode. In contact to this, in the case of the P-channel TFT, the influence of hot carrier deterioration is small. Thus, it is unnecessary to provide the overlap region particularly. In this case, the TFT can be manufactured by more simple steps.

Figure 9A:
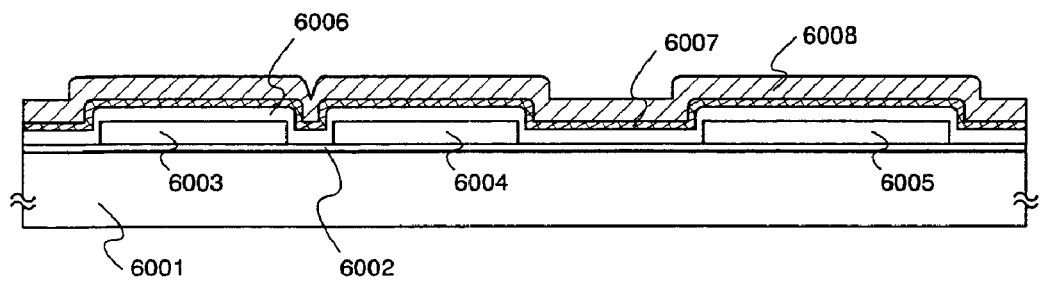
FIG. 9 is a diagram showing the example of manufacturing steps of a display device.

As shown in FIG. 9A, based on Embodiment 4, a base film 6002 is formed on an insulating substrate 6001 made of glass or the like. Next, island-like semiconductor layers 6003 to 6005, a gate insulating film 6006, and conductive layers 6007 and 6008 are formed. Here, the conductive layers 6007 and 6008 are formed to be a laminate structure. They may be formed to be a single layer particularly.

Figure 9B:
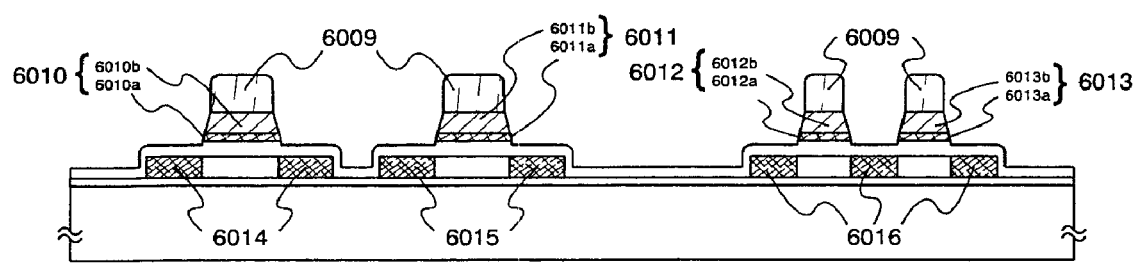

Then, as shown in FIG. 9B, a mask 6009 made of resist is formed and first etching processing is performed. In Embodiment 4, anisotropic etching is conducted utilizing a selection ratio between materials for the conductive layers formed to be a laminate structure. Here, it is unnecessary to provide the overlap region particularly. Thus, general etching is preferably conducted. In this time, regions which are thinned by about 20 nm to 50 nm are formed to the gate insulating film 6006 by etching.

Subsequently, first doping processing for adding an impurity element for providing a p-type to the island-like semiconductor layers is performed. Thus, impurity regions are formed in a self-alignment manner using conductive layers 6010 to 6013 as masks to the impurity element. The impurity element for providing the p-type is typically boron (B) or the like. Here, the impurity regions are formed by an ion doping method using diborane ($B_2H_6$) such that a concentration of the impurity in the semiconductor layers is $2\times10^{20}$ atoms/cm$^3$ to $2\times10^{21}$ atoms/cm$^3$.

Figure 9C:
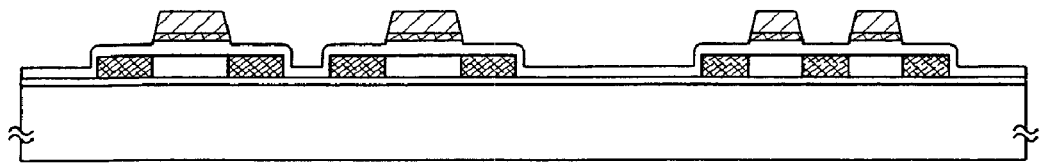
Figure 10:
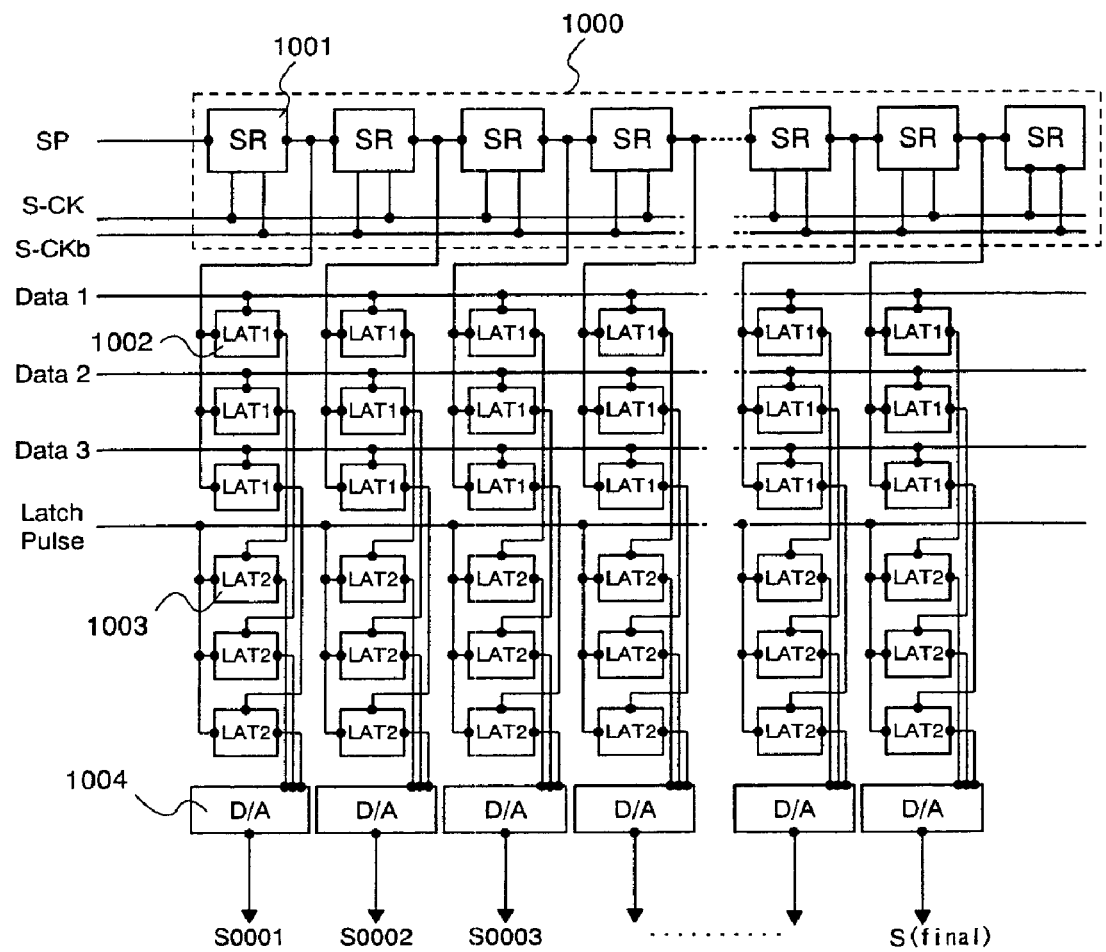
FIG. 10 is a diagram showing the structure of a source signal line driver circuit.

The mask made of the resist is removed to obtain a state shown in FIG. 9C. Hereinafter, the TFTs are manufactured based on the steps conducted after the step shown in FIG. 8B in Embodiment 2.

Embodiment 5

A method of manufacturing a light emitting device using light emitting elements such as EL elements in a pixel portion is explained in Embodiment 5.

Processing is performed in accordance with the process of manufacturing disclosed in Embodiment 2 up through formation of a first interlayer insulating film and a second interlayer insulating film, as shown in FIGS. 8A and 8B.

Figure 12A:
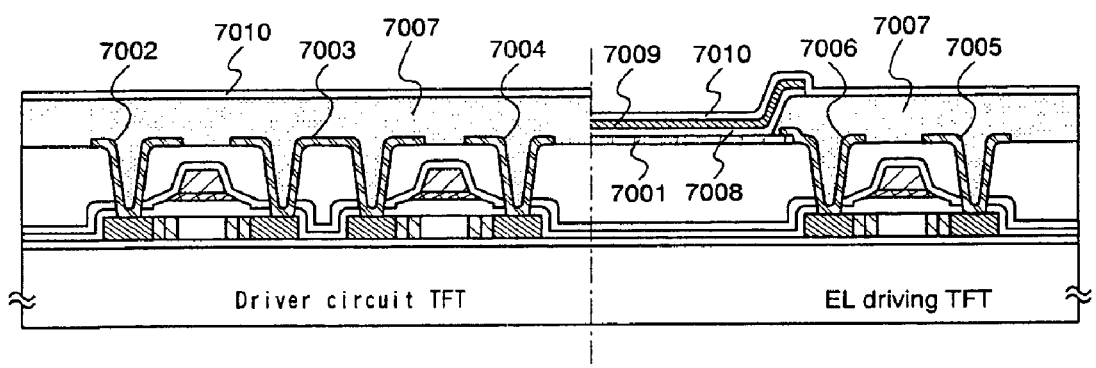
FIG. 12 is a diagram showing the example of the manufacturing steps of a light emitting device.

Contact holes are then opened as shown in FIG. 12A. The contact holes are formed by using dry etching or wet etching, and are formed in order to reach impurity regions, source signal lines, gate signal lines, electric current supply lines, and gate electrodes, respectively.

Next, a transparent conductive film, typically ITO or the like, is formed and patterned into a predetermined shape as an EL element anode 7001. A laminate film made from Ti, Al containing Ti, and Ti is formed, and patterned into a predetermined shape, forming wiring electrodes 7002 to 7005 and a pixel electrode 7006. The film thickness of each of the layers may be set similarly to those of Embodiment 2. The pixel electrode 7006 is formed so as to overlap with the anode 7001 already formed, thus exhibiting contact.

An insulating film made from an organic resin materials such as acryl is formed, and an opening portion is formed in a location corresponding to the EL element anode 7001 in order to form third interlayer insulating film 7007. Tapered shape sidewalls can easily be formed here by using wet etching when forming the opening portion. EL layer deterioration, cut step, and the like become conspicuous problems caused by steps for cases in which the sidewalls do not have a sufficiently smooth tapered shape, and it is therefore necessary to exert caution.

An EL layer 7008 is formed next, after which an EL element cathode 7009 is formed from cesium (Cs) having a thickness equal to or less than 2 nm, and silver (Ag) having a thickness equal to or less than 10 nm. Light generated by the EL layer is transmitted through the cathode 7009 to be emitted by making the film thickness of the EL element cathode 7009 extremely thin.

A protective film 7010 is formed next in order to protect the EL element. Work to attach an FPC and the like is then performed, after which the light emitting device is completed.

Figure 12B:
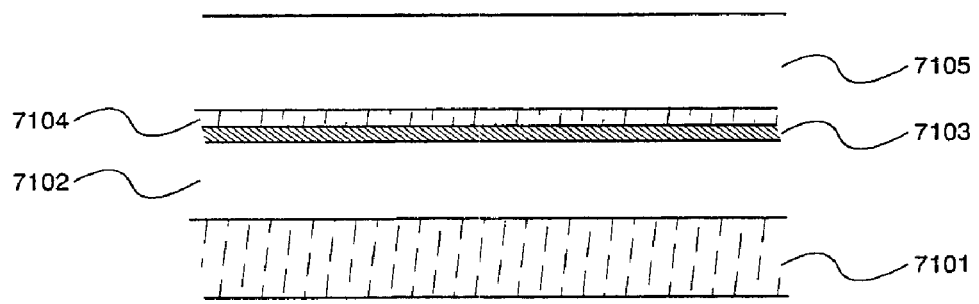

The detailed structure of the EL elements in the light emitting device shown in FIG. 12A is shown in FIG. 12B in Embodiment 5. The EL element anode 7101 is made from a transparent conductive film, typically ITO. Reference numeral 7102 denotes an EL layer containing a light emitting layer. The EL element cathode is made from a Cs film 7103 and an Ag film 7104 each having an extremely thin thickness. Reference numeral 7105 denotes a protective film.

Light generated by an EL layer 7102 is emitted in an upward direction after being transmitted through the cathodes 7103 and 7104 constituting the cathode by forming the cathode side of the EL element with an extremely thin film thickness. That is, the surface area of the light emitting area is overwhelmed by a region where TFTs are formed, and therefore an aperture ratio of nearly 100% can be achieved.

Through the steps above, the structure in which the upper side of the EL layer is a cathode and the lower side thereof is an anode is explained. However, the upper side of the EL layer can be an anode and the lower side thereof can be a cathode by forming the pixel electrode of lower side of the EL layer by using TiN and the like, and by forming electrode of upper side of EL layer by using ITO and the like.

Needless to say, though the aperture ratio is lowered a little, the model can be formed in that the lower side of the EL layer is an anode, the upper side of the EL layer is a cathode, wherein an electrode at the lower side of the EL layer is formed by ITO and the like, an electrode at the upper side of the EL layer is formed by MgAg and the like dissimilar to this embodiment, and then the light generated from the EL layer is emitted to the side where TFT is formed, that is, downward.

Embodiment 6

A process of manufacturing a light emitting device by a method that differs from Embodiment 5 is explained in Embodiment 6.

Processing is performed in accordance with the process of manufacturing disclosed in Embodiment 2 up through formation of a first interlayer insulating film and a second interlayer insulating film, as shown in FIGS. 8A and 8B.

Figure 13A:
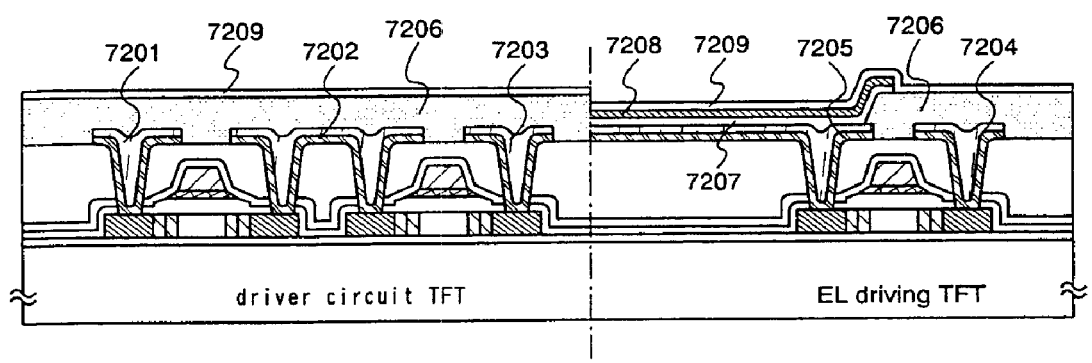
FIG. 13 is a diagram showing the example of the manufacturing steps of a light emitting device.

Contact holes are then opened as shown in FIG. 13A. The contact holes are formed by using dry etching or wet etching, and are formed in order to reach n-type impurity regions, source signal lines, gate signal lines, electric current supply lines, and gate electrodes, respectively.

Wirings 7201 to 7204 are then formed, and a pixel electrode 7205 which serves as an EL element anode is formed as a laminate film made from Ti, Al containing Ti, Ti, and a transparent conductive film.

An insulating film made from an organic resin material such as acryl is formed next, an opening portion is formed in a location corresponding to the EL element anode 7205, and a third interlayer insulating film 7206 is formed. Tapered shape sidewalls can easily be formed here by using wet etching when forming the opening portion. EL layer deterioration, cut step, and the like become conspicuous problems caused by steps for cases in which the sidewalls do not have a sufficiently smooth tapered shape, and it is therefore necessary to exert caution.

An EL layer 7207 is formed next, after which an EL element cathode 7208 is formed from cesium (Cs) having a thickness equal to or less than 2 nm, and silver (Ag) having a thickness equal to or less than 10 nm. Light generated by the EL layer is transmitted through the cathode 7208 to be emitted by making the film thickness of the EL element cathode 7208 extremely thin.

A protective film 7209 is formed next in order to protect the EL element. Work to attach an FPC and the like is then performed, after which the light emitting device is complete.

Figure 13B:
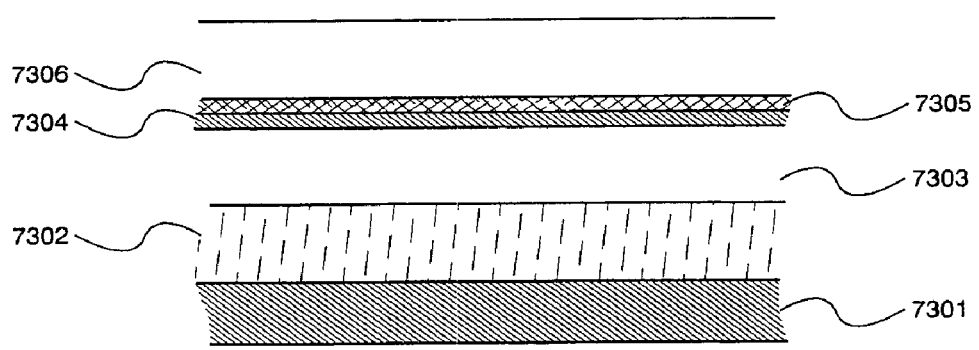

The detailed structure of the EL elements in the light emitting device shown in FIG. 13A is shown in FIG. 13B in Embodiment 6. The EL element anode is made from a metallic film 7301 which is a laminate film of Ti, Al, and Ti, and a transparent conductive film 7302, typically ITO. Reference numeral 7303 denotes an EL layer containing a light emitting layer. The EL element cathode is made from a Cs film 7304 and an Ag film 7305 each having an extremely thin thickness. Reference numeral 7306 denotes a protective film.

The light emitting device manufactured in accordance with Embodiment 6 has an advantage in that an aperture ratio of nearly 100% can be achieved, similar to the display device disclosed in Embodiment 5. In addition, it is possible to perform patterning of the metallic film made from a laminate of Ti, Al, Ti and the transparent conductive film by using a common photomask. It therefore becomes possible to reduce the number of photomasks and to simplify processing.

Through the steps above, the structure in which the upper side of the EL layer is a cathode and the lower side thereof is an anode is explained. However, the upper side of the EL layer can be an anode and the lower side thereof can be a cathode by forming the pixel electrode of lower side of the EL layer by using TiN and the like, and by forming electrode of upper side of EL layer by using ITO and the like.

Needless to say, though the aperture ratio is lowered a little, the model can be formed in that the lower side of the EL layer is an anode, the upper side of the EL layer is a cathode wherein an electrode at the lower side of the EL layer is formed by ITO and the like, an electrode at the upper side of the EL layer is formed by MgAg and the like for differing from this embodiment, and then the light generated from the EL layer is emitted to the side where TFT is formed, that is, downward.

Embodiment 7

Figure 16:
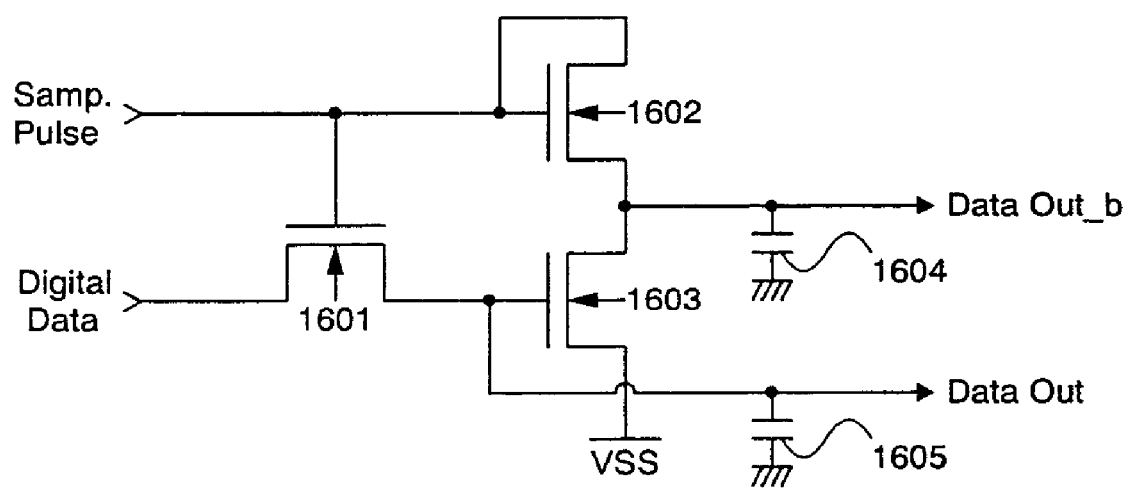
FIG. 16 is a diagram showing the example of a structure of a latch circuit of the present invention.

A connection of the latch circuit shown in FIG. 1 in which a bit of alteration is made is described in FIG. 16. In FIG. 1, an input electrode of the transistor 102 is connected to a power source VDD, however, in a latch circuit shown in FIG. 16, a sampling pulse is connected in order to input to an input electrode and a gate electrode of the TFT 1602 respectively. Description of an operation is omitted here because it is identical with Embodiment Mode. If there is no space to take along an power source wiring, this sort of connection can be made.

Embodiment 8

In Embodiment 1, the output of the first latch circuit is immediately inputted to the second latch circuit, and the compensation for amplitude attenuation is conducted by the buffer circuit located in the subsequent stage of the second latch circuit.

However, in this case, when an operational voltage is low and a threshold value of a TFT is large, the influence of attenuation corresponding to the threshold value on original amplitude is large. Thus, it is considered that the latch circuit does not conduct normal holding operation.

Therefore, an example in which an amplitude compensation buffer circuit is added to a subsequent stage of the first latch circuit will be described in this embodiment.

Figure 15:
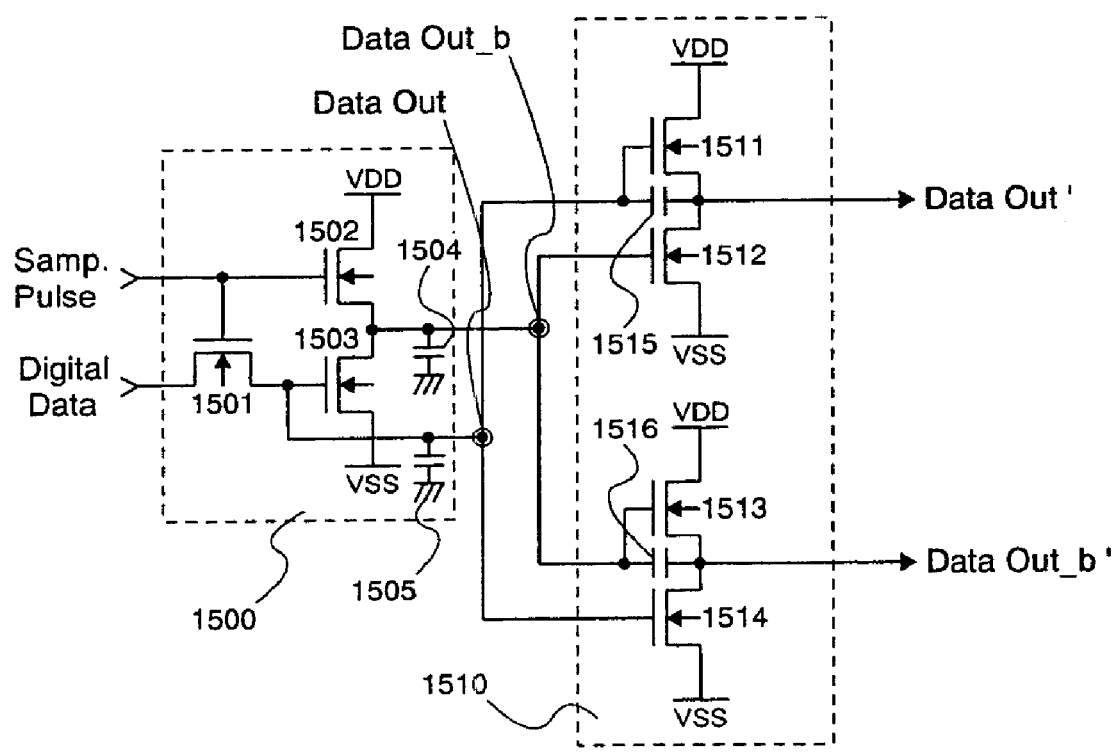
FIG. 15 is a diagram showing the example of a structure of a buffer circuit provided at the latter part of the first latch circuit.

FIG. 15 shows a configuration according to this embodiment. A portion surrounded by a dotted frame 1500 corresponds to the first latch circuit described in Embodiment Mode and Embodiment 1. The first latch circuit has TFTs 1501 to 1503 and capacitor means 1504 and 1505.

A portion surrounded by a dotted frame 1510 indicates an amplitude compensation buffer circuit for compensating an amplitude of the output of the first latch circuit, which has TFTs 1511 to 1514 and capacitor means 1515 and 1516.

The operations of the circuits will be described. Here, the same operation is conducted for a circuit composed of the TFTs 1511 and 1512 and the capacitor means 1515 and a circuit composed of the TFTs 1513 and 1514 and the capacitor means 1516 except that the polarities of the signals inputted thereto are opposite to each other. Hereinafter, the operation of only the circuit composed of the TFTs 1511 and 1512 and the capacitor means 1515 will be described.

A sampling pulse (Samp. Pulse) and a digital video signal (Digital Data) are inputted to the first latch circuit 1500, and a first output signal (Data Out) and a second output signal (Data Out_b) are outputted therefrom.

A signal outputted from the output electrode of the TFT 1501 is assumed to be the first output signal and a signal outputted from the output electrodes of the TFTs 1502 and 1503 is assumed to be the second output signal. The second output signal has a polarity opposite to that of the first output signal.

When the digital video signal (Digital Data) inputted to the first latch circuit is an H level, the first output signal is an H level and the second output signal is an L level. On the other hand, when the digital video signal (Digital Data) inputted to the first latch circuit is an L level, the first output signal is an L level and the second output signal is an H level.

Here, amplitudes of the first and second output signals are influenced by threshold values of the TFTs 1501 and 1502 in the first latch circuit. Thus, the respective amplitudes are in a range of (VDD−VthN) to VSS. In other words, the attenuation of the amplitude is caused by VthN.

When the first output signal is an H level and the second output signal is an L level, a signal having the H level is inputted to the gate electrode of the TFT 1511 and a signal having the L level is inputted to the gate electrode of the TFT 1512.

When a sampling period is elapsed in the first latch circuit, the sampling pulse becomes an L level and then the TFTs 1501 and 1502 are turned OFF. Thus, the respective gate electrodes of the TFTs 1511 and 1512 become a floating state while potentials at that instant are kept by the capacitor means 1504 and 1505.

At this time, a potential of the gate electrode of the TFT 1511 is an H level, that is, (VDD−VthN) and a potential of the gate electrode of the TFT 1512 is VSS. Thus, the TFT 1511 is turned ON and a potential of the output electrode thereof is risen. At this time, the TFT 1512 is turned OFF.

Here, a bootstrap acts by the capacitor means 1515, that is, capacitive coupling between the gate electrode and the output electrode of the TFT 1511 so that the potential of the gate electrode of the TFT 1511 is further risen from (VDD−VthN) and becomes higher than (VDD+VthN). Thus, the potential of the output electrode of the TFT 1511, that is, a potential of a buffer output (Data Out') becomes equal to VDD.

On the other hand, when a signal having an L level is inputted to the gate electrode of the TFT 1511 and a signal having an H level is inputted to the gate electrode of the TFT 1512, the buffer output becomes an L level.

The above operation is also conducted for the circuit composed of the TFTs 1513 and 1514 and the capacitor means 1516. When the buffer output is an H level, an inverting buffer output (Data Out_b') becomes an L level. When the buffer output is an L level, an inverting buffer output becomes an H level.

Thus, the amplitudes of the outputs of the first latch circuit are compensated so that normal amplitudes are obtained in a range of VDD to VSS and such outputs can be inputted to the second latch circuit.

Here, when a bootstrap acts between the gate electrode and the output electrode of the TFT 1511, the gate electrode of the TFT 1512 simultaneously becomes a floating state. Thus, even when a capacitor means is not particularly provided, there is a possibility that the potential of the gate electrode of the TFT 1512 is risen by a capacitor between the gate and the drain of the TFT 1512 itself. Therefore, when the TFT 1512 is turned ON, a malfunction is caused. In order to prevent this, it is desirable that a capacitance of a capacitor produced by the gate and the drain of the TFT 1512 is reduced, that is, a size of the TFT 1512 is set to be smaller than that of the TFT 1511.

In addition, it is needless to say that this embodiment may combines with the latch circuit shown in FIG. 16.

Embodiment 9

A semiconductor device of the present invention can be applied to fabrication of a display device used for various electronic equipments. Such electronic equipment includes a portable information terminal (electronic notebook, mobile computer, cellar phone, etc.), a video camera, a digital camera, a personal computer, a television, a portable telephone, and the like. FIGS. 14A to 14G show examples of those.

Figure 14A:
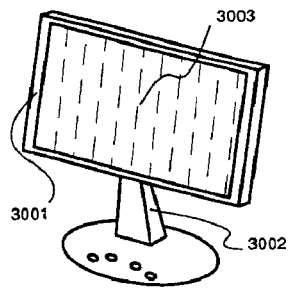
FIG. 14 is a diagram showing the example of an electronic apparatus to which the present invention is possible to apply.

FIG. 14A shows a liquid crystal display or an OLED display which is constituted by a housing 3001, a supporting stand 3002, a display portion 3003, and the like. The semiconductor device of the present invention can be applied to the fabrication of the display portion 3003.

Figure 14B:
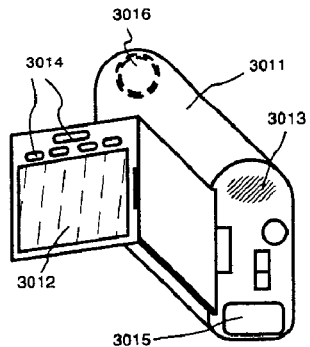

FIG. 14B shows a video camera which is constituted by a main body 3011, a display portion 3012, an audio input portion 3013, an operation switch 3014, a battery 3015, an image receiving portion 3016, and the like. The semiconductor device of the present invention can be applied to the fabrication of the display portion 3012.

Figure 14C:
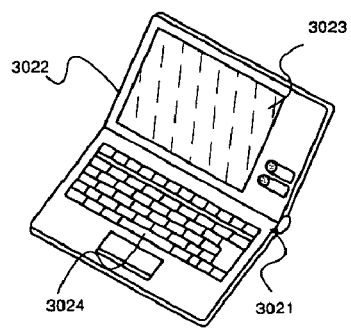

FIG. 14C shows a lap-top computer which is constituted by a main body 3021, a housing 3022, a display portion 3023, a keyboard 3024, and the like. The semiconductor device of the present invention can be applied to the fabrication of the display portion 3023.

Figure 14D:
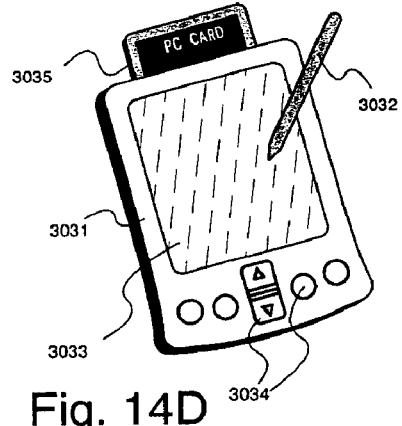

FIG. 14D shows a portable information terminal which is constituted by a main body 3031, a stylus 3032, a display portion 3033, an operation button 3034, an external interface 3035, and the like. The semiconductor device of the present invention can be applied to the fabrication of the display portion 3033.

Figure 14E:
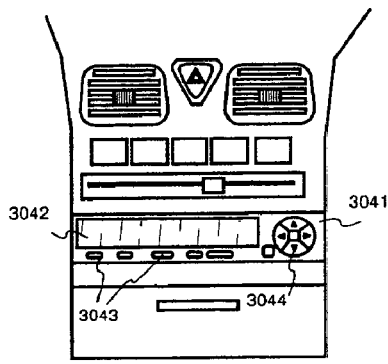

FIG. 14E shows a sound reproducing system, specifically an on-vehicle audio apparatus, which is constituted by a main body 3041, a display portion 3042, operation switches 3043 and 3044, and the like. The semiconductor device of the present invention can be applied to the fabrication of the display portion 3042. Additionally, although the on-vehicle audio apparatus is illustrated in this example, the invention can also be used for a portable or household audio apparatus.

Figure 14F:
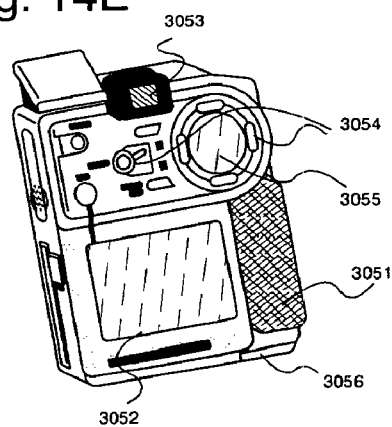

FIG. 14F shows a digital camera which is constituted by a main body 3051, a display portion (A) 3052, an eyepiece portion 3053, an operation switch 3054, a display portion (B) 3055, a battery 3056, and the like. The semiconductor device of the present invention can be applied to the fabrication of the display portion (A) 3052 and the display portion (B) 3055.

Figure 14G:
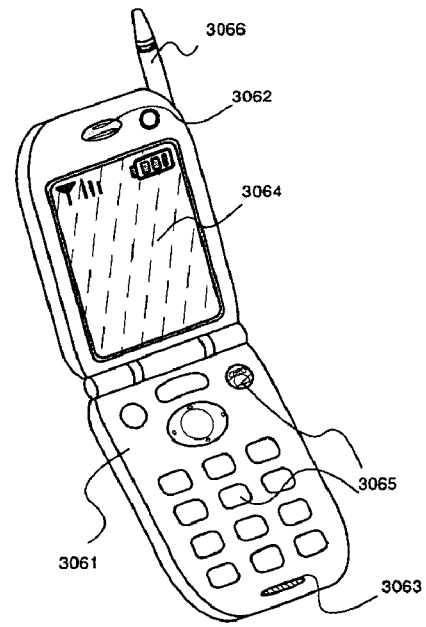

FIG. 14G shows a cellar phone which is constituted by a main body 3061, an audio output portion 3062, an audio input portion 3063, a display portion 3064, an operation switch 3065, an antenna 3066, and the like. The semiconductor device of the present invention can be applied to the fabrication of the display portion 3064.

Note that, the examples set forth above are merely examples, and the present invention is not limited to these applications.

According to the present invention, the latch circuit that is low power consumption and structured by using a single polarity TFT. By using the circuit, the pixel portion and the driver circuit of the display device that displays image by inputting a digital display signal can be structured by only a single polarity of TFT. Therefore, a part of the step of doping impurity elements can be omitted during a manufacturing step, and reduction in cost and improvement in yield can be realized.

What is claimed is:

1. A method of driving a semiconductor device comprising the steps of:
   inputting a first signal to gate electrodes of first and second transistors;
   inputting a second signal to a gate electrode of a third transistor and a first signal output portion through input and output electrodes of the first transistor in accordance with the input of the first signal;
   outputting an inverting signal of the second signal output to a second signal output portion from output electrodes of the second and third transistors in accordance with the input of the first signal;
   wherein the first, second, and third transistors have the same conductivity type,
   wherein a first capacitor means is located to the first signal output portion and keeps a potential of a signal outputted from the first signal output portion, and
   wherein a second capacitor means is located to the second signal output portion and keeps a potential of a signal outputted from the second signal output portion.

2. A method of driving a semiconductor device according to claim 1, wherein the signal outputted from the second signal output portion is an inverting signal of the signal outputted from the first signal output portion.

3. A method of driving a semiconductor device according to claim 1, wherein the conductivity type is an N-channel type.

4. A method of driving a semiconductor device according to claim 1, wherein the conductivity type is a P-channel type.

5. A method of driving a semiconductor device according to claim 1, wherein each of the first and second capacitor means is a capacitor means formed between a gate electrode and an input electrode of a transistor.

6. A method of driving a semiconductor device according to claim 1, wherein the first and second capacitor means each are composed of two materials selected from the group consisting of a material for forming a semiconductor layer, a material for forming the gate electrode, and a wiring material, and an insulating film interposed therebetween.

7. A method of driving a semiconductor device according to claim 1, wherein the semiconductor device is applied to an electronic equipment selected from the group consisting of a liquid crystal display, an OLED display, a video camera, a lap-top computer, a portable information terminal, a sound reproducing system, a digital camera and a cellular phone.

8. A method of driving a semiconductor device comprising the steps of:
   inputting a first signal to a gate electrode of a first transistor and gate and input electrodes of a second transistor;
   inputting a second signal to a gate electrode of a third transistor and a first signal output portion through input and output electrodes of the first transistor in accordance with the input of the first signal;
   outputting an inverting signal of the second signal output to a second signal output portion from output electrodes of the second and third transistors in accordance with the input of the first signal;
   wherein the first, second, and third transistors have the same conductivity type,
   wherein a first capacitor means is located to the first signal output portion and keeps a potential of a signal outputted from the first signal output portion, and
   wherein a second capacitor means is located to the second signal output portion and keeps a potential of a signal outputted from the second signal output portion.

9. A method of driving a semiconductor device according to claim 8, wherein the signal outputted from the second signal output portion is an inverting signal of the signal outputted from the first signal output portion.

10. A method of driving a semiconductor device according to claim 8, wherein the conductivity type is an N-channel type.

11. A method of driving a semiconductor device according to claim 8, wherein the conductivity type is a P-channel type.

12. A method of driving a semiconductor device according to claim 8, wherein each of the first and second capacitor means is a capacitor means formed between a gate electrode and an input electrode of a transistor.

13. A method of driving a semiconductor device according to claim 8, wherein the first and second capacitor means each are composed of two materials selected from the group consisting of a material for forming a semiconductor layer, a material for forming the gate electrode, and a wiring material, and an insulating film interposed therebetween.

14. A method of driving a semiconductor device according to claim 8, wherein the semiconductor device is applied to an electronic equipment selected from the group consisting of a liquid crystal display, an OLED display, a video camera, a lap-top computer, a portable information terminal, a sound reproducing system, a digital camera and a cellular phone.

15. A method of driving a semiconductor device comprising the steps of:
inputting a first signal to gate electrodes of first and second transistors;
inputting a second signal to a gate electrode of a third transistor and an output electrode of the first transistor through an input electrode of the first transistor in accordance with the input of the first signal;
inputting an inverting signal of the second signal to output electrodes of the second and third transistors in accordance with the input of the first signal;
compensating and attenuating an amplitude of the signal produced in the output electrode of the first transistor, and outputting it to a first signal output portion by an amplitude compensation buffer circuit; and
compensating and attenuating an amplitude of the signal produced in the output electrodes of the second and third transistors, and outputting it to a second signal output portion by the amplitude compensation buffer circuit,
wherein the first, second, and third transistors have the same conductivity type,
wherein a first capacitor means is located to the output electrode of the first transistor and keeps a potential of a signal outputted from the output electrode of the first transistor, and
wherein a second capacitor means is located to the output electrodes of the second and third transistors and keeps a potential of a signal outputted from the output electrodes of the second and third transistors.

16. A method of driving a semiconductor device according to claim 15, wherein the signal outputted from the second signal output portion is an inverting signal of the signal outputted from the first signal output portion.

17. A method of driving a semiconductor device according to claim 15, wherein the conductivity type is an N-channel type.

18. A method of driving a semiconductor device according to claim 15, wherein the conductivity type is a P-channel type.

19. A method of driving a semiconductor device according to claim 15, wherein each of the first and second capacitor means is a capacitor means formed between a gate electrode and an input electrode of a transistor.

20. A method of driving a semiconductor device according to claim 15, wherein the first and second capacitor means each are composed of two materials selected from the group consisting of a material for forming a semiconductor layer, a material for forming the gate electrode, and a wiring material, and an insulating film interposed therebetween.

21. A method of driving a semiconductor device according to claim 15, wherein the semiconductor device is applied to an electronic equipment selected from the group consisting of a liquid crystal display, an OLED display, a video camera, a lap-top computer, a portable information terminal, a sound reproducing system, a digital camera and a cellular phone.

22. A method of driving a semiconductor device comprising the steps of:
inputting a first signal to a gate electrode of first transistor and gate and input electrodes of second transistor;
inputting a second signal to a gate electrode of a third transistor and an output electrode of the first transistor through an input electrode of the first transistor in accordance with the input of the first signal;
inputting an inverting signal of the second signal to output electrodes of the second and third transistors in accordance with the input of the first signal;
compensating and attenuating an amplitude of the signal produced in the output electrode of the first transistor, and outputting it to a first signal output portion by an amplitude compensation buffer circuit; and
compensating and attenuating an amplitude of the signal produced in the output electrodes of the second and third transistors, and outputting it to a second signal output portion by the amplitude compensation buffer circuit,
wherein the first, second, and third transistors have the same conductivity type,
wherein a first capacitor means is located to the output electrode of the first transistor and keeps a potential of a signal outputted from the output electrode of the first transistor, and
wherein a second capacitor means is located to the output electrodes of the second and third transistors and keeps a potential of a signal outputted from the output electrodes of the second and third transistors.

23. A method of driving a semiconductor device according to claim 22, wherein the signal outputted from the second signal output portion is an inverting signal of the signal outputted from the first signal output portion.

24. A method of driving a semiconductor device according to claim 22, wherein the conductivity type is an N-channel type.

25. A method of driving a semiconductor device according to claim 22, wherein the conductivity type is a P-channel type.

26. A method of driving a semiconductor device according to claim 22, wherein each of the first and second capacitor means is a capacitor means formed between a gate electrode and an input electrode of a transistor.

27. A method of driving a semiconductor device according to claim 22, wherein the first and second capacitor means each are composed of two materials selected from the group consisting of a material for forming a semiconductor layer, a material for forming the gate electrode, and a wiring material, and an insulating film interposed therebetween.

28. A method of driving a semiconductor device according to claim 22, wherein the semiconductor device is applied to an electronic equipment selected from the group consisting of a liquid crystal display, an OLED display, a video camera, a lap-top computer, a portable information terminal, a sound reproducing system, a digital camera and a cellular phone.

29. A method of driving a semiconductor device comprising the steps of:
inputting a first signal to gate electrodes of first and second transistors;
inputting a second signal to a gate electrode of a third transistor and an output electrode of the first transistor through an input electrode of the first transistor in accordance with the input of the first signal;
inputting an inverting signal of the second signal to output electrodes of the second and third transistors in accordance with the input of the first signal;
inputting the signal produced in the output electrode of the first transistor to gate electrodes of fourth and fifth transistors;
inputting the signal produced in the output electrodes of the second and third transistors to gate electrodes of sixth and seventh transistors
wherein the first to seventh transistors have the same conductivity type, a first capacitor means is located to the output electrode of the first transistor and keeps a potential of a signal outputted from the output electrode of the first transistor, a second capacitor means is located to the output electrodes of the second and third transistors and keeps a potential of a signal outputted from the output electrodes of the second and third transistors, a third capacitor means is located between the gate electrode and the output electrode of the fourth transistor to produce capacitive coupling, and a fourth capacitor means is located between the gate electrode and the output electrode of the seventh transistor to produce capacitive coupling.

30. A method of driving a semiconductor device according to claim 29, wherein the signal outputted from the second signal output portion is an inverting signal of the signal outputted from the first signal output portion.

31. A method of driving a semiconductor device according to claim 29, wherein the conductivity type is an N-channel type.

32. A method of driving a semiconductor device according to claim 29, wherein the conductivity type is a P-channel type.

33. A method of driving a semiconductor device according to claim 29, wherein each of the first to fourth capacitor means is a capacitor means formed between a gate electrode and an input electrode of a transistor.

34. A method of driving a semiconductor device according to claim 29, wherein the first to fourth capacitor means each are composed of two materials selected from the group consisting of a material for forming a semiconductor layer, a material for forming the gate electrode, and a wiring material, and an insulating film interposed therebetween.

35. A method of driving a semiconductor device according to claim 29, wherein the semiconductor device is applied to an electronic equipment selected from the group consisting of a liquid crystal display, an OLED display, a video camera, a lap-top computer, a portable information terminal, a sound reproducing system, a digital camera and a cellular phone.

36. A method of driving a semiconductor device comprising the steps of:

inputting a first signal to a gate electrode of first transistor and gate and input electrodes of second transistor;

inputting a second signal to a gate electrode of a third transistor and an output electrode of the first transistor through an input electrode of the first transistor in accordance with the input of the first signal;

inputting an inverting signal of the second signal to output electrodes of the second and third transistors in accordance with the input of the first signal;

inputting the signal produced in the output electrode of the first transistor to gate electrodes of fourth and fifth transistors;

inputting the signal produced in the output electrodes of the second and third transistors to gate electrodes of sixth and seventh transistors wherein the first to seventh transistors have the same conductivity type, a first capacitor means is located to the output electrode of the first transistor and keeps a potential of a signal outputted from the output electrode of the first transistor, a second capacitor means is located to the output electrodes of the second and third transistors and keeps a potential of a signal outputted from the output electrodes of the second and third transistors, a third capacitor means is located between the gate electrode and the output electrode of the fourth transistor to produce capacitive coupling, and a fourth capacitor means is located between the gate electrode and the output electrode of the seventh transistor to produce capacitive coupling.

37. A method of driving a semiconductor device according to claim 36, wherein the signal outputted from the second signal output portion is an inverting signal of the signal outputted from the first signal output portion.

38. A method of driving a semiconductor device according to claim 36, wherein the conductivity type is an N-channel type.

39. A method of driving a semiconductor device according to claim 36, wherein the conductivity type is a P-channel type.

40. A method of driving a semiconductor device according to claim 36, wherein each of the first to fourth capacitor means is a capacitor means formed between a gate electrode and an input electrode of a transistor.

41. A method of driving a semiconductor device according to claim 36, wherein the first to fourth capacitor means each are composed of two materials selected from the group consisting of a material for forming a semiconductor layer, a material for forming the gate electrode, and a wiring material, and an insulating film interposed therebetween.

42. A method of driving a semiconductor device according to claim 36, wherein the semiconductor device is applied to an electronic equipment selected from the group consisting of a liquid crystal display, an OLED display, a video camera, a lap-top computer, a portable information terminal, a sound reproducing system, a digital camera and a cellular phone.

* * * * *